(12) United States Patent
Shiba

(10) Patent No.: US 7,575,950 B2
(45) Date of Patent: Aug. 18, 2009

(54) SEMICONDUCTOR DEVICE AND A METHOD OF MANUFACTURING THE SAME

(75) Inventor: Kazuyoshi Shiba, Tsuchiura (JP)

(73) Assignee: Renesas Technology Corp., Tokyo (JP)

( * ) Notice: Subject to any disclaimer, the term of this patent is extended or adjusted under 35 U.S.C. 154(b) by 82 days.

(21) Appl. No.: 11/339,674

(22) Filed: Jan. 26, 2006

(65) Prior Publication Data

US 2006/0172466 A1 Aug. 3, 2006

(30) Foreign Application Priority Data

Jan. 28, 2005 (JP) ............................. 2005-021951

(51) Int. Cl.
*H01L 21/00* (2006.01)

(52) U.S. Cl. ................ 438/95; 365/163; 257/E31.029; 438/281

(58) Field of Classification Search ................ 438/257, 438/106, 124, 113, 107, 126, 132, 279, 128, 438/215; 365/200, 163; 257/209, 529, E23.149, 257/E31.029
See application file for complete search history.

(56) References Cited

U.S. PATENT DOCUMENTS

| | | | | |
|---|---|---|---|---|
| 4,546,454 A * | 10/1985 | Gupta et al. | ................ | 365/200 |
| 4,607,219 A * | 8/1986 | Isosaka | ........................ | 438/15 |
| 5,080,096 A * | 1/1992 | Hooper et al. | ................. | 607/30 |
| 5,566,386 A * | 10/1996 | Kumakura et al. | .......... | 365/226 |
| 6,812,531 B1 * | 11/2004 | Baldi et al. | ................. | 257/390 |
| 6,928,022 B2 * | 8/2005 | Cho et al. | ................. | 365/225.7 |
| 7,180,102 B2 * | 2/2007 | Hui | .............................. | 257/153 |
| 2003/0161195 A1 * | 8/2003 | Zonca et al. | ................. | 365/200 |
| 2004/0013007 A1 * | 1/2004 | Eilert | .......................... | 365/200 |
| 2004/0090838 A1 * | 5/2004 | Kuroda et al. | ................ | 365/200 |
| 2004/0224483 A1 * | 11/2004 | Takyu et al. | ................. | 438/462 |
| 2005/0237840 A1 * | 10/2005 | Diorio et al. | ............. | 365/225.7 |
| 2006/0013034 A1 * | 1/2006 | Lowrey et al. | .............. | 365/148 |
| 2006/0163734 A1 * | 7/2006 | Thei et al. | .................... | 257/758 |

FOREIGN PATENT DOCUMENTS

| JP | 2001-257324 | 9/2001 |
|---|---|---|
| JP | 2004-079138 | 3/2004 |

OTHER PUBLICATIONS

Burcin, L.;Ramaswamy, S.; Hunt, K.; Maimon, J.; Conway,, T.; Li, B.; Bumgarner, A.; Michael, G.; Rodgers, J. "A 4-bit Non-Volatile Chalogenide Random Access Memory", IEEE, Aerospace Conference, Mar. 5-12, 2005, pp. 1-8.*

* cited by examiner

*Primary Examiner*—W. David Coleman
*Assistant Examiner*—Shaka Scarlett
(74) *Attorney, Agent, or Firm*—Antonelli, Terry, Stout & Kraus, LLP.

(57) ABSTRACT

A semiconductor device having improved performance and improvement manufacturing yield is provided. After a semiconductor integrated circuit including a phase change memory and a nonvolatile memory other than a phase change memory is formed in a semiconductor substrate, an inspection step such as a probe inspection is performed. In accordance with the result of the inspection, data is stored in the nonvolatile memory other than a phase change memory. At this stage, the data is not stored in the phase change memory. Then, the semiconductor substrate is cut by dicing or the like into separate pieces corresponding to individual semiconductor chips. Each of the separate pieces of semiconductor chips is packaged.

9 Claims, 25 Drawing Sheets

| STATE OF PHASE-CHANGE FILM 35 | AMORPHOUS PHASE | CRYSTALLINE PHASE |
|---|---|---|
| RESISTANCE OF PHASE-CHANGE FILM 35 | HIGH RESISTANCE | LOW RESISTANCE |

|  | PHASE-CHANGE MEMORY IN PHASE-CHANGE MEMORY REGION 2 | NONVOLATILE MEMORY IN ELECTRIC FUSE REGION 7 |
|---|---|---|
| BEFORE PACKAGING | INFORMATION IS NOT RECORDED | INFORMATION IS RECORDED |
| AFTER PACKAGING | INFORMATION IS RECORDED | INFORMATION IS NOT REWRITTEN OR INFORMATION IS REWRITTEN |

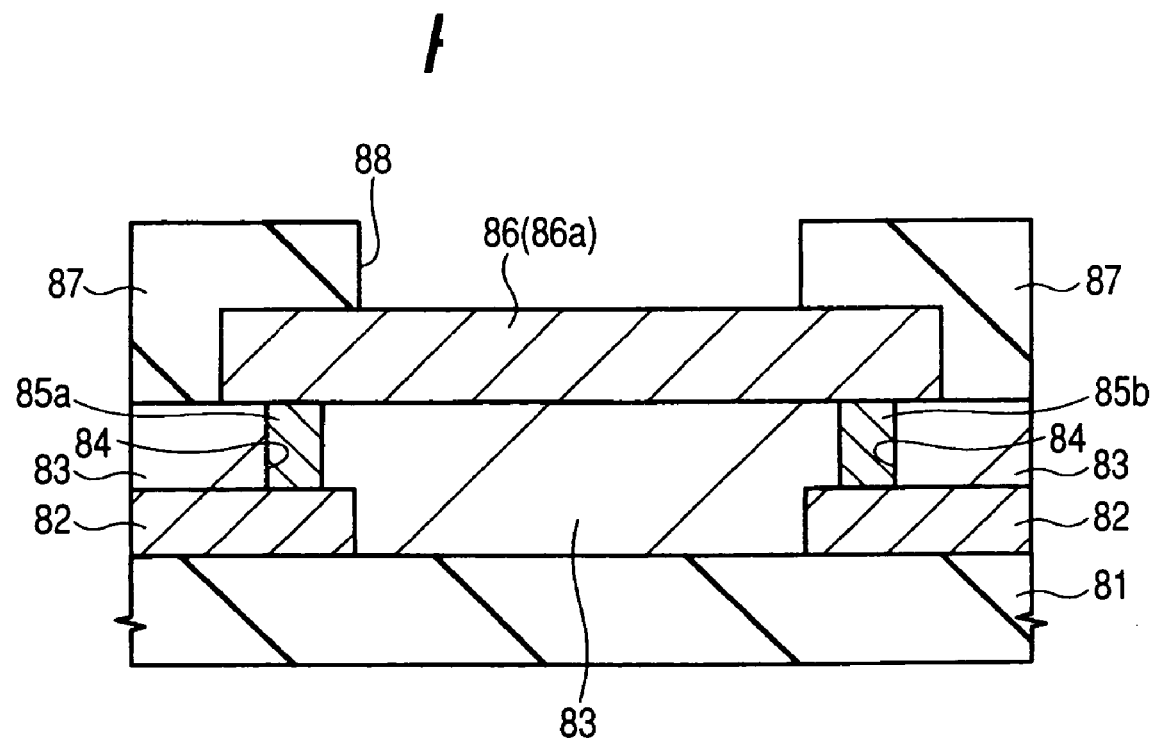
FIG. 33
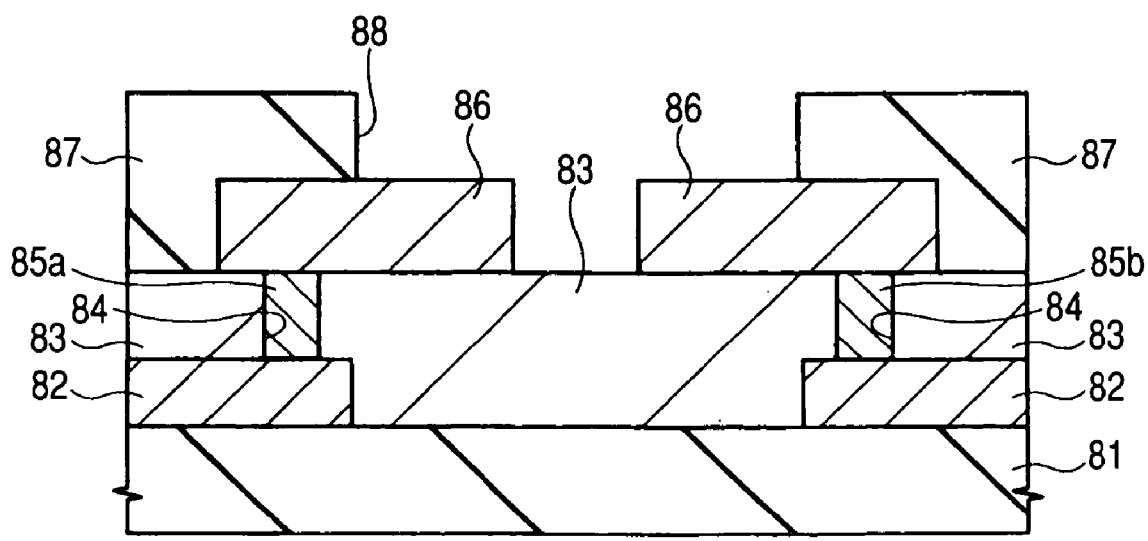

FIG. 34

|  | PHASE-CHANGE MEMORY IN PHASE-CHANGE MEMORY REGION 2 | FUSE ELEMENT IN ELECTRIC FUSE REGION 7 |
|---|---|---|
| BEFORE PACKAGING | INFORMATION IS NOT RECORDED | INFORMATION IS RECORDED |
| AFTER PACKAGING | INFORMATION IS RECORDED | INFORMATION IS NOT REWRITTEN |

SEMICONDUCTOR DEVICE AND A METHOD OF MANUFACTURING THE SAME

CROSS-REFERENCE TO RELATED APPLICATION

The present application claims priority from Japanese patent application No. 2005-021951 filed on Jan. 28, 2005, the content of which is hereby incorporated by reference into this application.

BACKGROUND OF THE INVENTION

The present invention relates to a semiconductor device and a method of manufacturing the same and, more particularly, to a technology which is effective when applied to a semiconductor device including a nonvolatile memory of a phase change type and a method of manufacturing the same.

In a nonvolatile semiconductor memory device for executing data storage, data storage in a memory cell is embodied in various forms, including a phase change memory. The phase change memory is a nonvolatile memory constructed to cause a phase change between an amorphous state and a crystalline state in the phase change film (chalcogenide layer) of each memory cell and thereby change the resistivity of the phase change film such that, during an access, a current passing through each memory cell changes in accordance with stored information.

Japanese Unexamined Patent Publication No. 2001-257324 (Patent Document 1) discloses a technology which relieves a faulty bit in a memory cell of a DRAM by using a fuse.

Japanese Unexamined Patent Publication No. 2004-79138 (Patent Document 2) discloses a technology related to a phase change memory.

[Patent Document 1] Japanese Unexamined Patent Publication No. 2001-257324

[Patent Document 2] Japanese Unexamined Patent Publication No. 2004-79138

SUMMARY OF THE INVENTION

As a result of a study, the present inventors have made the following findings.

By forming a nonvolatile memory of a phase change memory, a small-size, large-capacity, and high-speed memory can be implemented. However, the phase change memory is low in thermal retention resistance since it uses whether the phase change film is in an amorphous state or in a crystalline state as the stored information. As a result, when a semiconductor chip is heated disadvantageously while it is packaged in the assembly of a semiconductor package, the information stored in the phase change memory is lost. Even though a wafer inspection is performed after the formation of the nonvolatile memory composed of the phase change memory in a semiconductor wafer and the result of the inspection is stored in the nonvolatile memory composed of the phase change memory, the stored information is lost during the assembly of the semiconductor package and cannot be used after the assembly of the semiconductor package. This prevents effective reflection of the result of the wafer inspection and may probably cause a reduction in the yield of a semiconductor device.

In particular, the present inventors have studied the use of a phase change memory as a fuse element. However, because the phase change memory is low in thermal retention as described above, the information stored in the phase change memory may be lost when the phase change memory is used as the fuse element. Thus, the present inventors have found the problem that the phase change memory does not function as the fuse element.

An object of the present invention is to provide a technology which allows an improvement in the manufacturing yield of a semiconductor device.

Another object of the present invention is to provide a technology which allows an improvement in the performance of the semiconductor device.

The above and other objects and novel features of the present invention will become apparent from the description of the present specification and the accompanying drawings.

A brief description will be given to the outline of the representative aspects of the present invention disclosed in the present application.

The present invention forms a nonvolatile memory of a phase change type and a nonvolatile memory of a non-phase change type in a semiconductor substrate.

The present invention also forms a nonvolatile memory of a phase change type and a nonvolatile memory of a non-phase change type in a semiconductor substrate and then stores information in the nonvolatile memory of the non-phase change type before packaging a semiconductor chip.

The following is the brief description of effects achievable by the representative aspects of the invention disclosed in the present application.

The present invention allows an improvement in the manufacturing yield of a semiconductor device.

The present invention also allows an improvement in the performance of the semiconductor device.

BRIEF DESCRIPTION OF THE DRAWINGS

FIG. 32 is a main-portion cross-sectional view of a semiconductor device according to a second embodiment of the present invention;

FIG. 33 is a main-portion cross-sectional view showing a state in which a fuse element is broken; and FIG. 34 is an illustrative view showing a method of using the fuse element in the electric fuse region and the phase change memory in the phase change memory region.

DETAILED DESCRIPTION OF THE PREFERRED EMBODIMENTS

Figure 1:
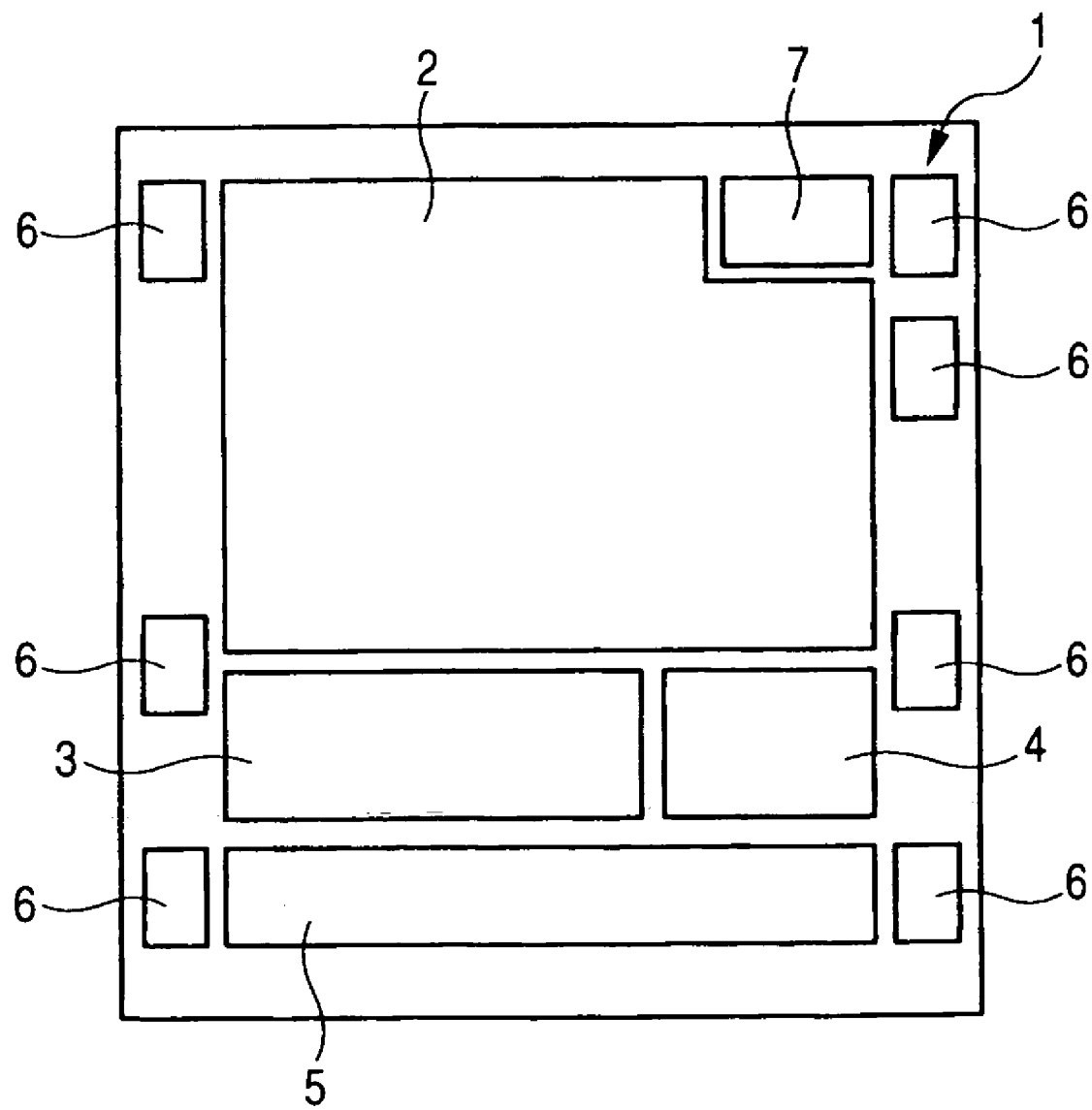
FIG. 1 is a plan view showing a schematic structure of a semiconductor device according to a first embodiment of the present invention.

In the following embodiments, a description will be given to the present invention by dividing it, if necessary for the sake of convenience, into a plurality of sections. However, they are by no means irrelevant to each other unless shown particularly explicitly and are mutually related to each other such that one of the sections is a variation or a detailed or complementary description of some or all of the others. If the number and the like of elements (including the number, numerical value, amount, and range thereof) are referred to in the following embodiments, they are not limited to specific numbers unless shown particularly explicitly or unless they are obviously limited to specific numbers in principle. The number and the like of the elements may be not less than or not more than specific numbers. It will easily be appreciated that, in the following embodiments, the components thereof (including also elements and steps) are not necessarily indispensable unless shown particularly explicitly or unless the components are considered to be obviously indispensable in principle. Likewise, if the configurations, positional relationship, and the like of the components are referred to in the following embodiments, the configurations and the like are assumed to include those substantially proximate or similar thereto unless shown particularly explicitly or unless obviously they are not in principle. The same shall apply to the foregoing numeric values and the range.

Herein below, the embodiments of the present invention will be described in detail with reference to the drawings. Throughout the drawings for illustrating the embodiments, parts having the same functions are designated by the same reference numerals and the repeated description thereof will be omitted. In the foregoing embodiments, the description of the same or like parts will not be repeated in principle unless particularly necessary.

There are cases where hatching may be omitted even in cross-sectional views for clarity of illustration used in the drawings used in the embodiments. Alternatively, even plan views may be hatched for clarity of illustration.

Embodiment 1

A semiconductor device according to the present embodiment and a method of manufacturing the same will be described with reference to the drawings. FIG. 1 is a plan view (plan layout view or chip layout view) showing a schematic structure of the semiconductor device (nonvolatile semiconductor memory device or semiconductor chip) according to the present embodiment.

The semiconductor device (semiconductor chip) 1 according to the present embodiment is a semiconductor device (semiconductor memory device) including a phase change memory (nonvolatile memory element of a phase change type, PCM (Phase Change Memory), or OUM (Ovonic Unified Memory)) as a nonvolatile memory of the phase change type. As shown in FIG. 1, the semiconductor device 1 according to the present embodiment has: a phase change memory region (phase change memory formation region or phase change memory circuit region) 2 formed with the phase change memory (memory cell array thereof) as the nonvolatile memory of the phase change type (nonvolatile memory of a first type); a RAM region 3 formed with a RAM (Random Access Memory) circuit such as a DRAM (Dynamic RAM) or a SRAM (Static RAM); a CPU region 4 formed with a logic circuit such as a CPU (Central Processing Unit) or an MPU (Micro Processing Unit); an analog circuit region 5 formed with an analog circuit; I/O regions 6 each formed with an input/output circuit; and an electric fuse region (electric fuse circuit or electric fuse circuit region) 7 formed with a nonvolatile memory of a non-phase change type (nonvolatile memory other than a phase change memory or nonvolatile memory of a second type).

In the phase change memory region 2, the phase change memory (nonvolatile memory of the phase change type)

forms the nonvolatile memory for storing a relatively large capacity of information as one of main circuits in the semiconductor device 1. The phase change memory is the nonvolatile memory constructed to cause a phase change between an amorphous state and a crystalline state in the phase change film (corresponding to a phase change film 35 which will be described later) of each memory cell and thereby change the resistivity (resistance value) thereof such that, during an access, a current passing through each memory cell changes in accordance with stored information. The phase change memory uses the phase state (whether the phase change film is in the amorphous state or in the crystalline state) of the phase change film as the stored information. During an access to the phase change memory, information stored in a selected memory cell as the access target can be read therefrom based on a current passing therethrough.

In the electric fuse region 7, a nonvolatile memory for storing a relatively small capacity of desired information from the main circuit of the semiconductor device 1 is formed. Examples of the desired information stored in the nonvolatile memory of the electric fuse region 7 include an address at which an effective (in-use) element used during trimming in the semiconductor device 1 is located, an address at which an effective memory cell (faultless memory cell) for memory relief is located, the manufacturing number of the semiconductor device, and the history (manufacturing history) of the semiconductor device.

The nonvolatile memory formed in the electric fuse region 7 is of a type different from that of the nonvolatile memory (i.e., phase change memory) formed in the phase change memory region 2 and is composed of the nonvolatile memory of the non-phase change type (nonvolatile memory other than a phase change memory). Specifically, the nonvolatile memory formed in the electric fuse region 7 uses the state of charge accumulation in a charge accumulation region, such as a floating gate or a trapping insulating film, as stored information in the same manner as in, e.g., an EPROM (Erasable and Programmable Read Only Memory) or an EEPROM (Electrically Erasable and Programmable Read Only Memory) and reads the stored information as the threshold of a transistor (field effect transistor or MISFET (Metal Insulator Semiconductor Field Effect Transistor)). Through charge injection or charge release to or from the charge accumulation region, the threshold of the transistor is shifted so that the nonvolatile memory is allowed to operate as a memory element. Accordingly, the recording of information in the nonvolatile memory in the electric fuse region 7 is performed through charge injection or charge release to or from the charge accumulation region.

Thus, the semiconductor device 1 according to the present embodiment has the nonvolatile memory of the phase change type (phase change memory in the phase change memory region 2) and the nonvolatile memory of the non-phase change type (nonvolatile memory in the electric fuse region 7) which are formed in the same semiconductor substrate.

A description will be given to the steps of manufacturing the semiconductor device 1 according to the present embodiment with reference to FIGS. 2 to 13.

FIGS. 2, 4, 6 to 11, and 13 are main-portion cross-sectional views of the semiconductor device 1 according to the present embodiment in the manufacturing steps therefor. FIGS. 3, 5, and 12 are main-portion plan views of the semiconductor device 1 according to the present embodiment in the manufacturing steps therefor. FIG. 3 corresponds to the main-portion plan view at the same step stage as FIG. 2. FIG. 5 corresponds to the main-portion plan view at the same step stage as FIG. 4. FIG. 12 corresponds to the main-portion plan view at the same step stage as FIG. 11. In each of the cross-sectional views, the portion denoted by the reference letters A and A' corresponds to the cross section along the line A-A' in the corresponding plan view and the portion denoted by the reference letters B and B' corresponds to the cross section along the line B-B' in the corresponding plan view. Since FIGS. 3, 5, and 12 correspond to the main-portion plan views of the electric fuse region 7 in the semiconductor device 1, the portion denoted by the reference letters A and A' and the portion denoted by the reference letters B and B' correspond to the main-portion cross-sectional view of the electric fuse region 7 in the semiconductor device 1. In each of the cross-sectional views, the portion denoted by the reference letters C and C' shows the cross section of a portion (region formed with an n-channel MISFET) of a peripheral circuit region. In each of the cross sections, the portion denoted by the reference letters D and D' denotes the main-portion cross-sectional view of the phase change memory region 2 in the semiconductor device 1. In each of the plan views, only the primary conductive layers composing the nonvolatile memory cell in the electric fuse region 7 and regions connected thereto are shown and the depiction of an insulating film formed between the conductive layers and the like will be omitted in principle. The n-channel MISFET (MISFET shown in the portion denoted by the reference letters C and C') composing a peripheral circuit and the like form an X-decoder circuit, a Y-decoder circuit, a sense amplifier circuit, an input/output (the input/output circuit in each of the I/O regions 6), a logic circuit (logic circuit in the CPU region 4), and the like.

Figure 2:
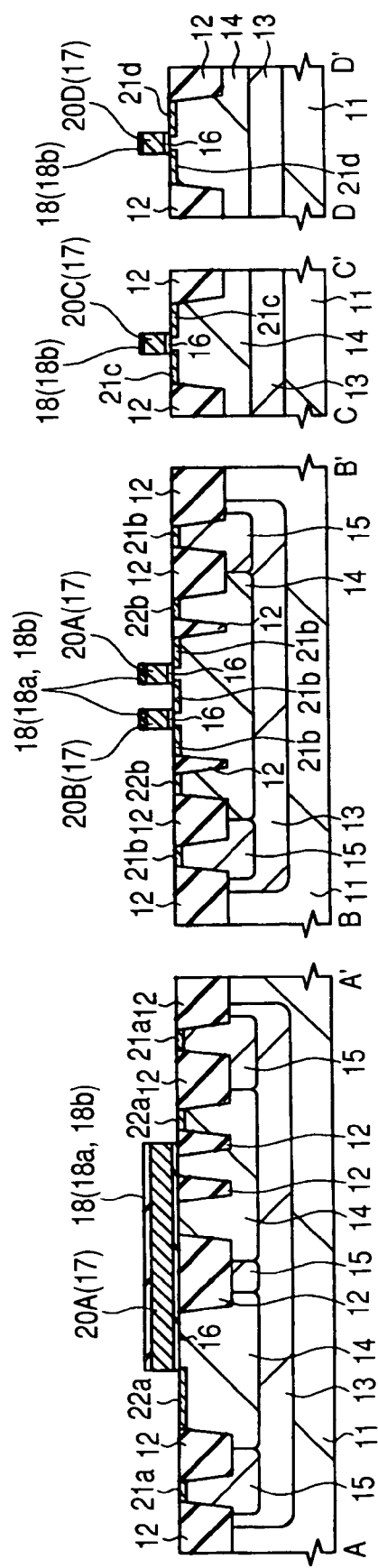
FIG. 2 is a main-portion cross-sectional view of the semiconductor device according to the first embodiment in a manufacturing step therefor.
Figure 3:
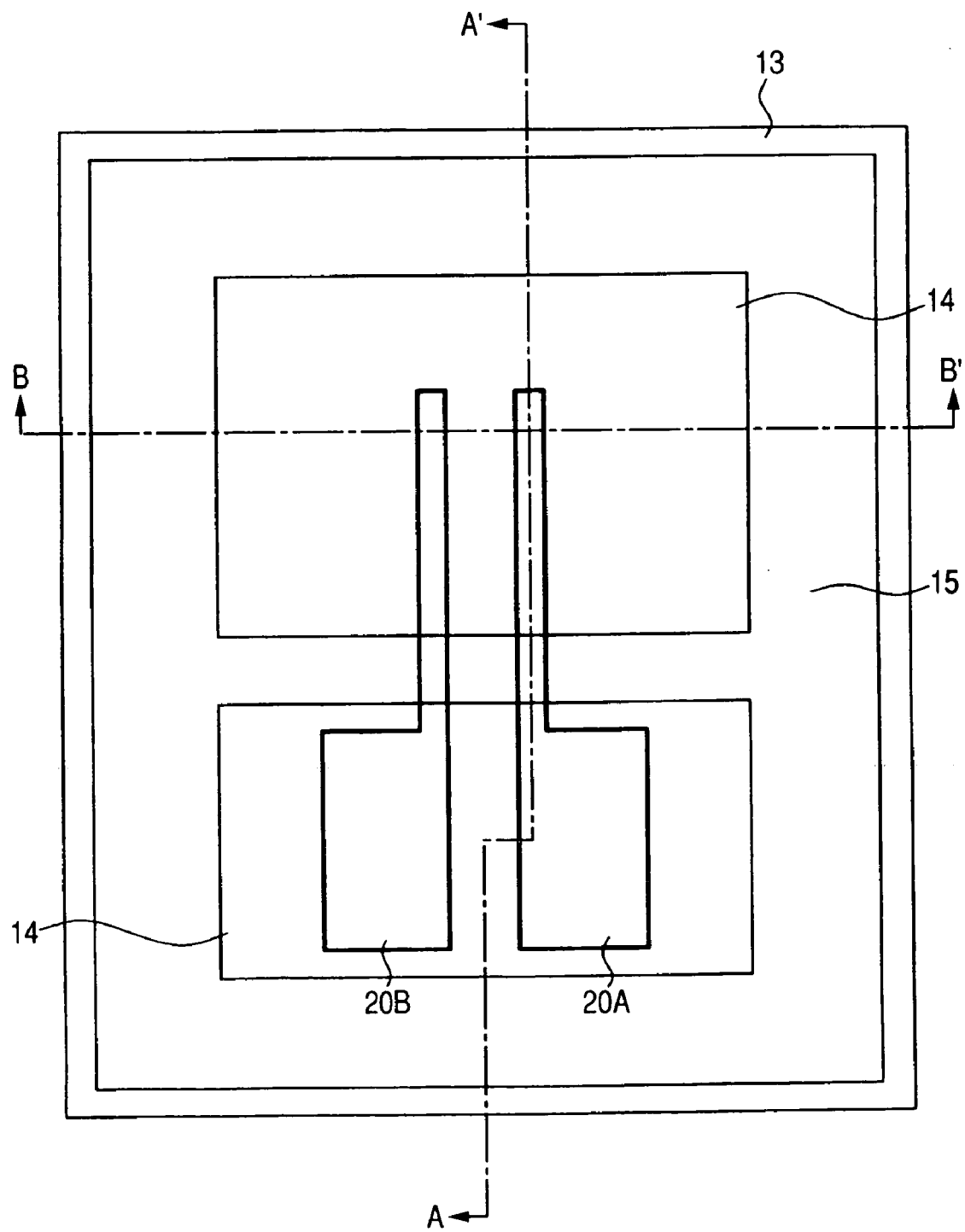
FIG. 3 is a main-portion plan view of the semiconductor device in the same manufacturing step as shown in FIG. 2.

First, as shown in FIGS. 2 and 3, a semiconductor substrate (semiconductor wafer hereinafter simply referred to as the substrate) 11 made of, e.g., a p-type monocrystalline silicon is prepared. Then, an isolation region 12 is formed in the main surface of the substrate 11. To form the isolation region 12, a trench is formed by, e.g., performing dry etching with respect to the main surface of the substrate 11, subsequently depositing an insulating film such as a silicon oxide film by CVD (Chemical Vapor Deposition) on the substrate 11 including the inside of the trench, and then polishing away the unneeded portion of the insulating film located outside the trench by CMP (Chemical Mechanical Polishing), while leaving the insulating film inside the trench, whereby the isolation region 12 composed of the insulating film buried in the trench (isolation trench) is formed successfully. Otherwise, a LOCOS (Local Oxidization of Silicon) may also be formed appropriately by thermal oxidization. By thus forming the isolation region 12, an active region having the boundary thereof defined by the isolation region 12 is formed in the main surface of the substrate 11.

Next, an n-type impurity (e.g., P (phosphorous) or As (arsenic)) is ion implanted into, e.g., a portion of the substrate 11. Then, a thermal process is performed with respect to the substrate 11 to diffuse the impurity into the substrate 11, thereby forming an n-type semiconductor isolation region 13.

Next, an n-type impurity (e.g., P (phosphorus) is ion implanted into, e.g., a portion of the substrate 11 and a p-type impurity (e.g., B (boron)) is ion implanted into another portion of the substrate 11. Then, a thermal process is performed with respect to the substrate 11 to diffuse the impurities into the substrate 11, thereby forming a p-type well 14 and an n-type well 15 in the main surface of the substrate 11.

Next, the substrate 11 is thermally oxidized to form a gate insulating film 16 made of, e.g., a silicon oxide or the like on the surface of each of the p-type well 14 and the n-type well 15.

Next, a polycrystalline silicon film (doped polysilicon film or conductor film) 17 having an n-type impurity or the like introduced therein is formed by, e.g., CVD or the like over the entire surface of the substrate 11, i.e., on the gate insulating film 16. Subsequently, an insulating film 18a composed of a silicon oxide film or the like is formed by, e.g., CVD on the polycrystalline silicon film 17. An impurity can be introduced into the polycrystalline silicon film 17 during or after the deposition of the polycrystalline film 17. Then, the insulating film 18a is removed from each of the phase change memory region 2 and the peripheral circuit region by dry etching using a photoresist film (not shown) patterned by a photolithographic technique as an etching mask. Thereafter, an insulating film 18b composed of a silicon oxide film or the like is formed by, e.g., CVD over the entire surface of the substrate 11.

Next, the insulating films 18a and 18b on the substrate 11 are patterned by dry etching using a photoresist film (not shown) patterned by a photolithographic technique as an etching mask. Subsequently, the polycrystalline silicon film 17 is patterned by dry etching using a photoresist film or the remaining insulating films 18a and 18b as an etching mask to form gate electrodes 20A, 20B, 20C, and 20D each composed of the patterned polycrystalline silicon film 17. Each of the insulating films 18a and 18b on the gate electrodes 20A, 20B, 20C, and 20D serves as a cap insulating film 18. The cap insulating film 18 on each of the gate electrodes 20A and 20B in the electric fuse region 7 is composed of the insulating films 18a and 18b, while the cap film 18 on each of the gate electrodes 20C and 20D in the peripheral circuit region and the phase change memory region 2 is composed of the insulating film 18b. As a result, the thickness of the cap insulating film 18 on each of the gate electrodes 20A and 20B in the electric fuse region 7 is larger than the thickness of the cap film 18 on each of the gate electrodes 20C and 20D in the peripheral circuit region 2 and the phase change memory region 2.

Next, an n-type impurity (e.g., P (phosphorus) or As (arsenic)) is ion implanted into a portion of each of the p-type well 15 and the n-type well 15, thereby forming n-type semiconductor regions 21a, 21b, 21c, and 21d each at a relative low impurity concentration. On the other hand, a p-type impurity (e.g., B (boron)) is ion implanted into a portion of the p-type well 14, thereby forming p-type semiconductor regions 22a and 22b each at a relative low impurity concentration. The n-type semiconductor regions 21a, 21b, 21c, and 21d and the p-type semiconductor regions 22a and 22b are lower in impurity concentration than n-type semiconductor regions 24A, 24B, 24C, and 24D and p-type semiconductor regions 25A and 25B, which will be described later.

Figure 4:
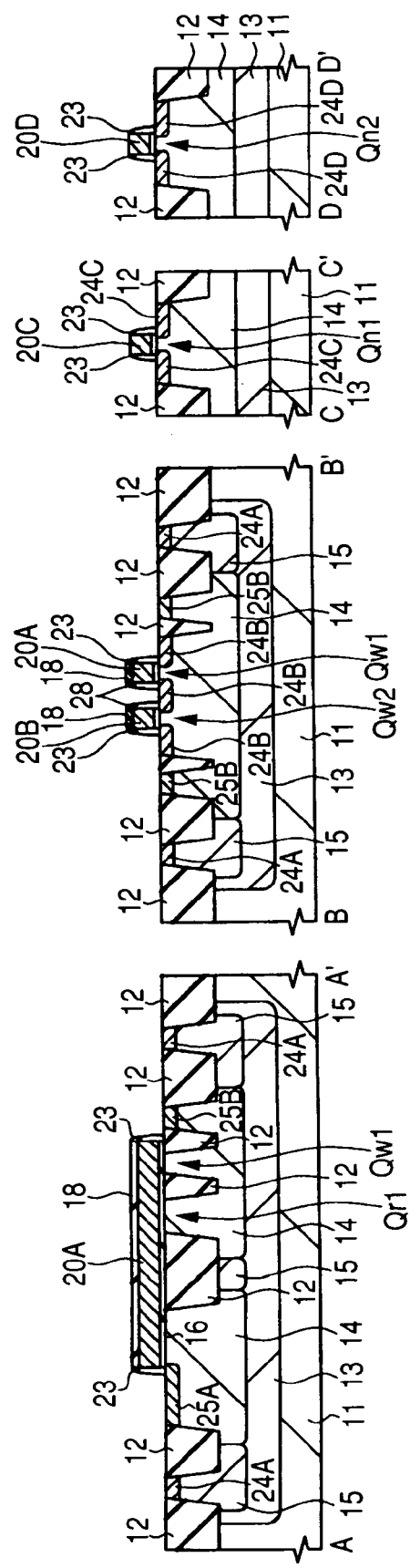
FIG. 4 is a main-portion cross-sectional view of the semiconductor device in the manufacturing step subsequent to that shown in FIG. 2.
Figure 5:
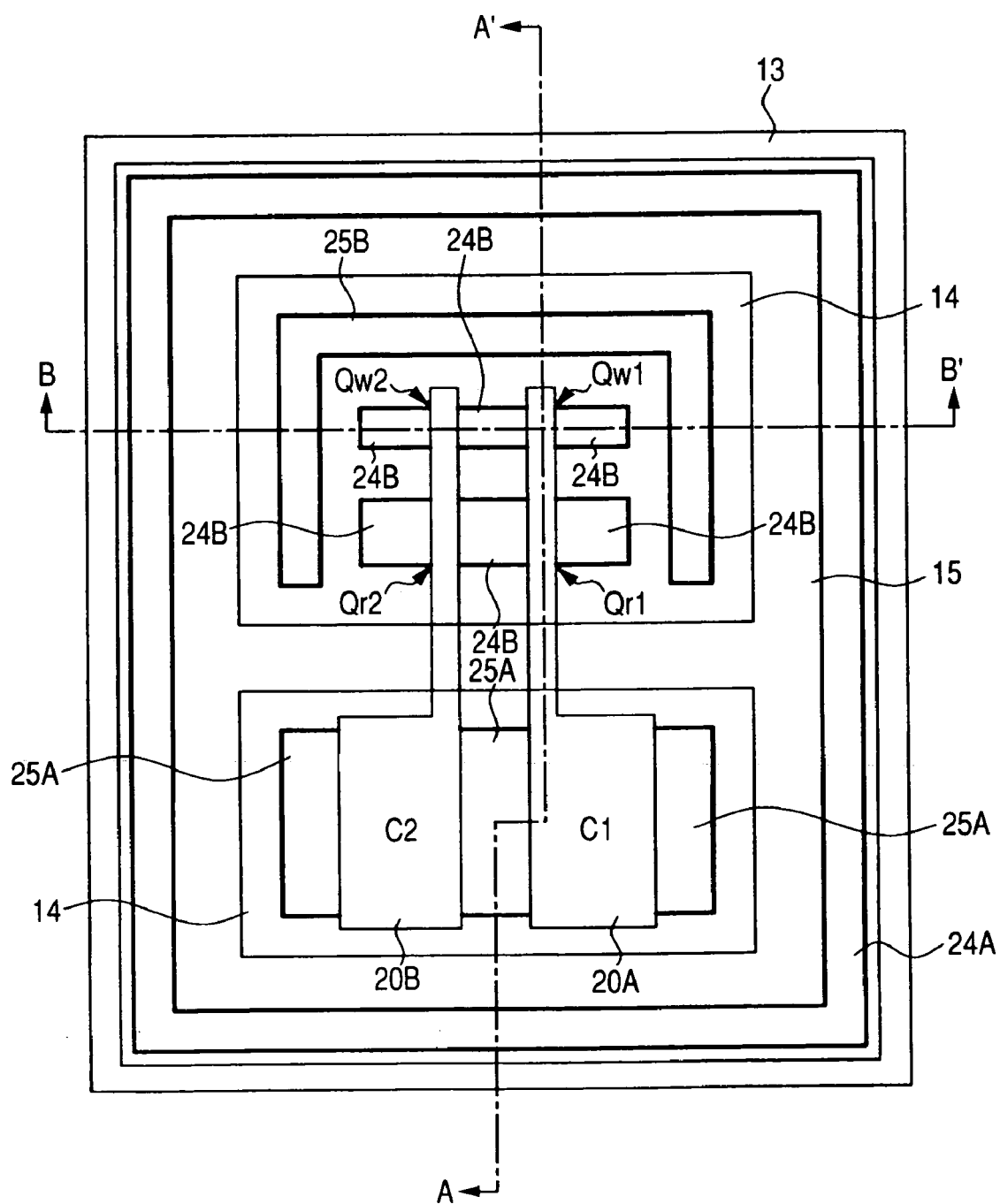
FIG. 5 is a main-portion plan view of the semiconductor device in the same manufacturing step as shown in FIG. 4.

Next, as shown in FIGS. 4 and 5, a silicon oxide film or the like is deposited by CVD or the like on the substrate 1. Then, the silicon oxide film and the cap insulating film 18 are anisotropically etched to form sidewall spacers (sidewall insulating films) 23 on the respective sidewalls of the gate electrodes 20A, 20B, 20C, and 20D. When the silicon oxide film is anisotropically etched to form the sidewall spacers 23, the cap insulating film 18 remains on each of the gate electrodes 20A and 20B in memory cells in the electric fuse region 7, while the cap film 18 is removed in each of the peripheral circuit region and the phase change memory region 2 so that the surfaces of the gate electrodes 20C and 20D are exposed. This is because the thickness of the cap insulating film 18 in each of the memory cells in the electric fuse region 7 has become larger than the thickness of the cap film 18 in each of the peripheral circuit region and the phase change memory region 2 at the stage at which the gate electrodes 20A, 20B, 20C, and 20D have been processed and etching is halted at the time at which the surface of each of the gate electrodes 20C and 20D in the peripheral circuit region and the phase change memory region 2 are exposed during the formation of the sidewall spacers 23.

Next, an n-type impurity (e.g., P (phosphorus) or As (arsenic)) is ion implanted into a portion of each of the p-type well 14 and the n-type well 15, thereby forming the n-type semiconductor regions 24A, 24B, 24C, and 25D. On the other hand, a p-type impurity (e.g., B (boron)) is ion implanted into a portion of the p-type well 14, thereby forming the p-type semiconductor regions 25A and 25B. In the drawings including FIG. 4 and subsequent thereto (except for FIGS. 6 to 8), the depiction of the n-type semiconductor regions 21a, 21b, 21c, and 21d each at a low impurity concentration and of the p-type semiconductor regions 22a and 22b each at a low impurity concentration is omitted for clarity of illustration and only the n-type semiconductor regions 24A, 24B, 24C, and 24D each at a high impurity concentration and the p-type semiconductor regions 25A and 25B each at a high impurity concentration are depicted as representatives.

By the steps described heretofore, MISFETs Qw1 and Qw2 for writing and erasing data which use the n-type semiconductor region 24B as the source and drain and use the gate electrodes 20A and 20B as the gate electrodes, MISFETs Qr1 and Qr2 for reading data which use the n-type semiconductor region 24B as the source and drain and use the gate electrodes 20A and 20B as the gate electrodes, and capacitor elements C1 and C2 which use the gate electrodes 20A and 20B and the p-type well 14 as the capacitor electrodes and use the gate insulating film 6 as the capacitor insulating films are formed in the memory cell region of the electric fuse region 7. In the memory cell region of the electric fuse region 7, the nonvolatile memory (nonvolatile memory element) which uses the gate electrodes 20A and 20B as the floating gates and uses the p-type semiconductor region 25A as the control gate is also formed. In the peripheral circuit region, an n-channel MISFET Qn1 which uses the n-type semiconductor region 24C as the source and drain and uses the gate electrode 20C as the gate electrode is formed. In the phase change memory region 2, an n-channel MISFET Qn2 which uses the n-type semiconductor region 24D as the source and drain and uses the gate electrode 20D as the gate electrode is formed.

Figure 6:
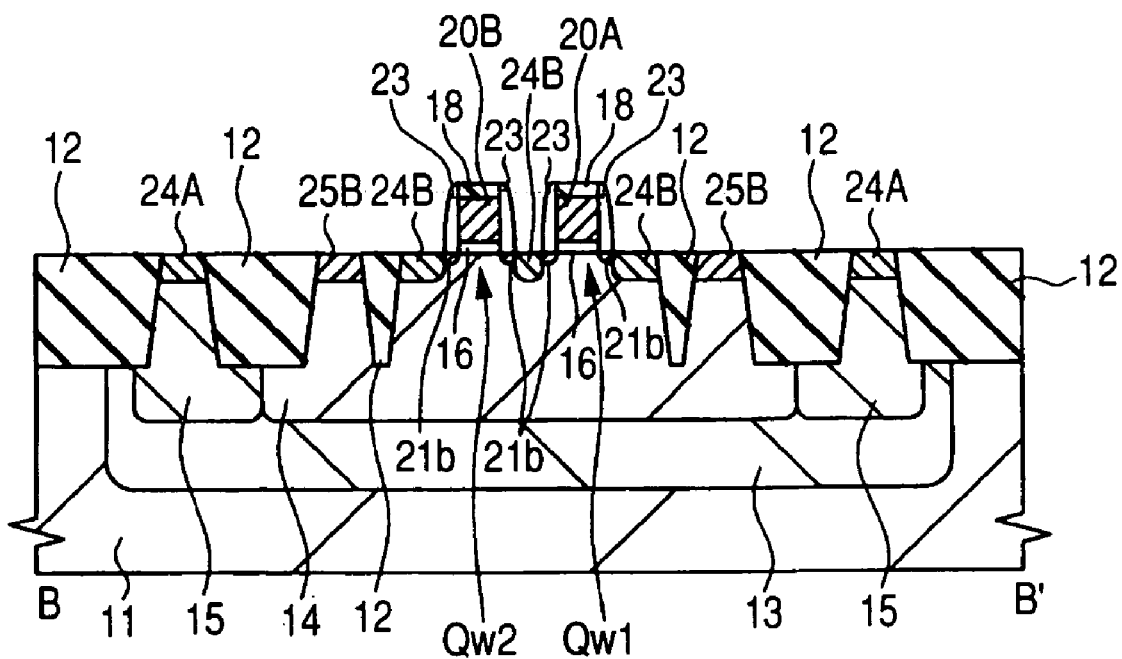
FIG. 6 is an enlarged view of FIG. 4.
Figure 7:
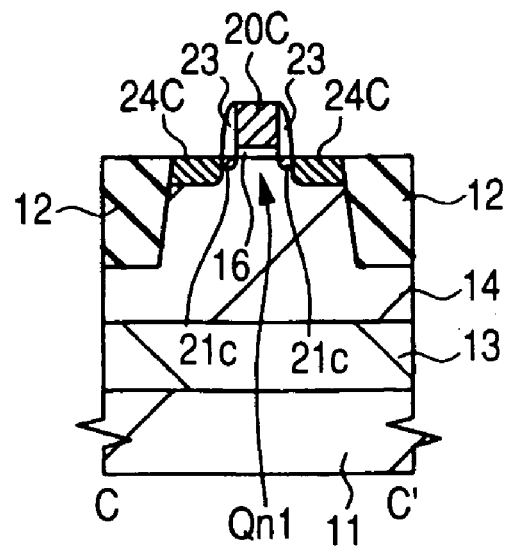
FIG. 7 is an enlarged view of FIG. 4.

FIG. 6 shows an enlarged view of the portion denoted by the reference letters B and B' of FIG. 4. FIG. 7 shows an enlarged view of the portion denoted by the reference letters C and C' of FIG. 4 and an enlarged view of the portion denoted by the reference letters D and D' of FIG. 4.

The region serving as the control gate of the nonvolatile memory (nonvolatile memory element) in the electric fuse region 7 is a region to which ion implantation for forming the p-type semiconductor region 22a at a low impurity concentration and forming the p-type semiconductor region 25A at a high impurity concentration has been performed. The power supply portion of the p-type well 14 is a region to which ion implantation for forming the p-type semiconductor region 22a at a low impurity concentration and forming the p-type semiconductor region 25B at a high impurity concentration has been performed. Likewise, the power supply portion of the n-type well 15 is a region to which ion implantation for forming the n-type semiconductor region 21a at a low impurity concentration and forming the n-type semiconductor region 24A at a high impurity concentration has been performed.

As shown in FIG. 6, the MISFETs Qw1 and Qw2 for writing and erasing data and the MISFETs Qr1 and Qr2 for reading data have the source/drain regions each composed of the n-type semiconductor region 21b at a low impurity concentration and the n-type semiconductor region 24B at a high impurity concentration. That is, each of the MISFETs Qw1, Qw2, Qr1, and Qr2 has an LDD (Lightly Doped Drain) structure. The description of the power supply portion of each of the p-type well 14 and the n-type well 15 is the same as given above.

As shown in FIG. 7, the n-channel MISFET Qn1 in the peripheral circuit region has the source/drain regions each composed of the n-type semiconductor region 21c at a low impurity concentration and the n-type semiconductor region 24C at a high impurity concentration. That is, the n-channel MISFET Qn1 has an LDD structure.

Figure 8:
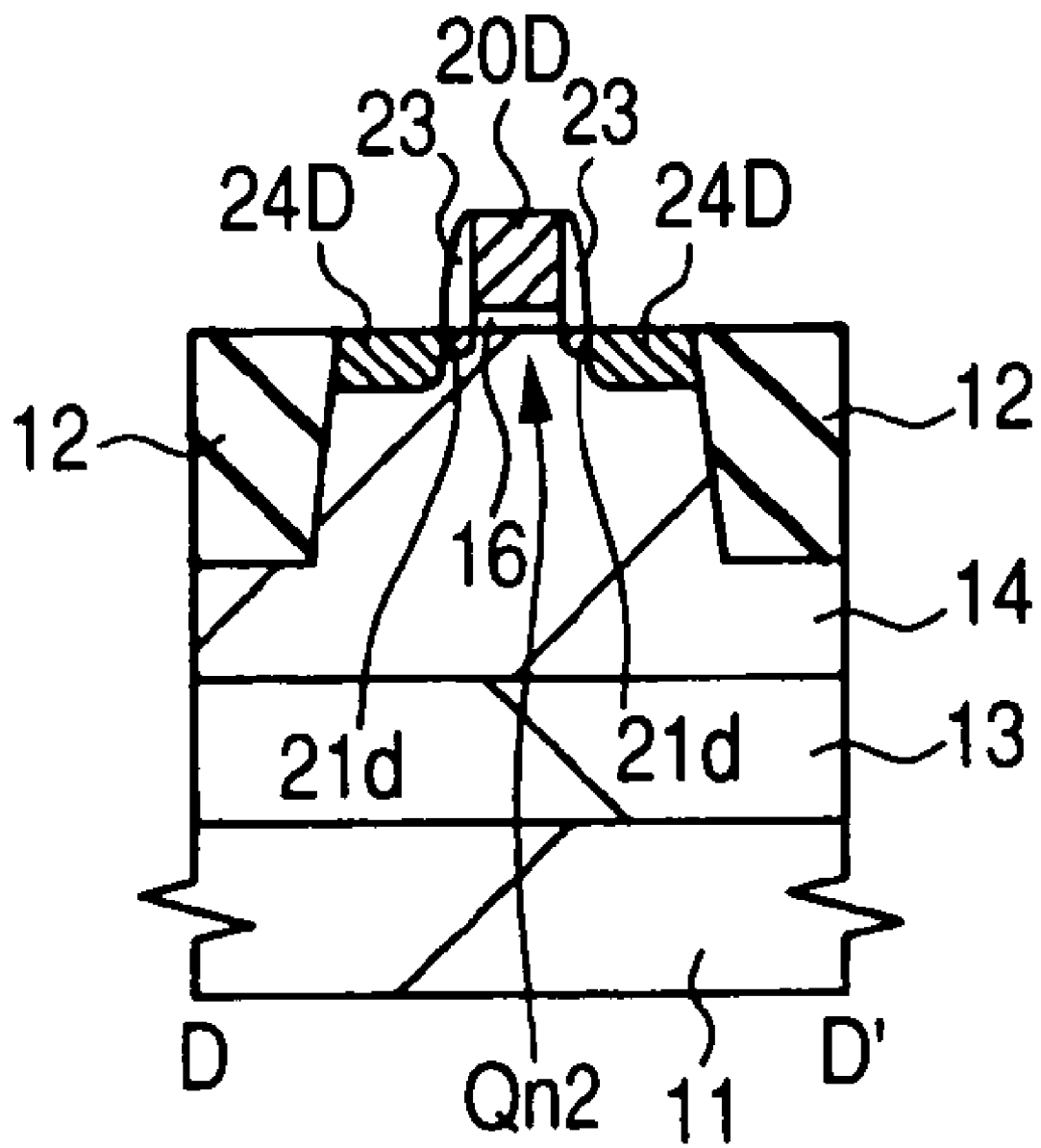
FIG. 8 is an enlarged view of FIG. 4.

As shown in FIG. 8, the n-channel MISFET Qn2 in the phase change memory region 2 has the source/drain regions each composed of the n-type semiconductor region 21d at a low impurity concentration and the n-type semiconductor region 24D at a high impurity concentration. That is, the n-channel MISFET Qn2 has an LDD structure.

Thus, the n-type semiconductor regions 21a to 21d are depicted in detail in FIGS. 6 to 8. In another drawing (such as FIG. 4), however, the depiction thereof is omitted for clarity of illustration so that the n-type semiconductor regions 21a to 21d are depicted in included relation as parts of the n-type semiconductor regions 24A to 24D and the p-type semiconductor regions 25A and 25B.

Figure 9:
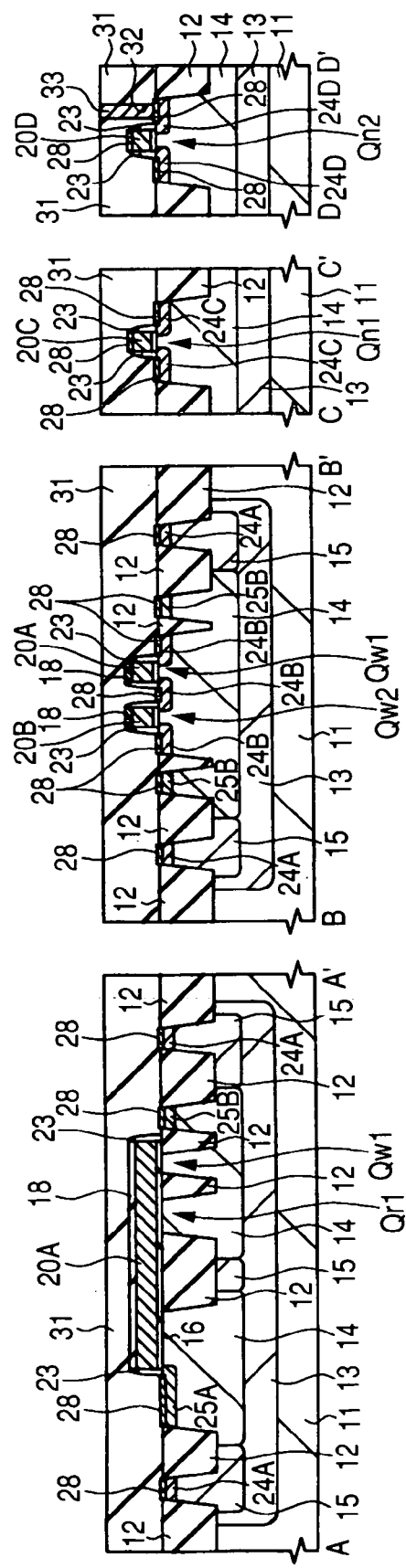
FIG. 9 is a main-portion cross-sectional view of the semiconductor device in the manufacturing step subsequent to that shown in FIG. 4.

Next, as shown in FIG. 9, a silicide layer (metal silicide) 28 is formed. The silicide layer 28 can be formed by, e.g., the following process. First, a Co (cobalt) film is deposited by sputtering or the like on the substrate 11. After a silicidization reaction is caused at the interface between the Co film and each of the gate electrodes 20C and 20D in the peripheral circuit region and the phase change memory region 2 and at the interface between the Co film and the substrate 11 by a thermal process, the unreacted Co film is removed by etching. As a result, the silicide ($CoSi_2$) layer 28 is formed on the surface of each of the gate electrodes 20C and 20D and on the surface of each of the sources and drains (n-type semiconductor regions 24B, 24C, and 24D). In the memory cell region of the electric fuse region 7, on the other hand, the silicide layer 28 is formed on the surface of each of the n-type semiconductor region 24A and the p-type semiconductor regions 25A and 25B. Since the cap insulating film 18 has been left on the surface of each of the gate electrodes 20A and 20B in the electric fuse region 7, the silicide layer 28 has not been formed. Although the present embodiment has shown Co (cobalt) as an example of the material of the silicide layer 28, the material of the silicide layer 28 is not limited thereto. Instead of Co (cobalt), it is also possible to use Ti (titanium), W (tungsten), Ni (nickel), or the like.

Next, an insulating film (interlayer insulating film) 31 is formed on the substrate 11 to cover the gate electrodes 20A, 20B, 20C, and 20D. The insulating film 31 is composed of a multilayer film of, e.g., a relatively thin lower-layer silicon nitride film and a relatively thick upper-layer silicon oxide film. The insulating film 31 may also be composed of a single-layer film such as a silicon oxide film. After the formation of the insulating film 31, it is also possible to perform a planarization process with respect to the upper surface of the insulating film 31 by CMP or the like as necessary.

Next, dry etching is performed with respect to the insulating film 31 by using a photoresist film (not shown) as an etching mask, thereby forming, in the insulating film 31, a contact hole 32 reaching one of the source and drain (n-type semiconductor region 24D) of the MISFET Qn2 in the phase change memory region 2.

Next, a plug 33 made of tungsten (W) or the like is formed in the contact hole 32. The plug 33 can be formed by, e.g., forming a barrier film (e.g., a titanium nitride film) over the insulating film 31 including the inside of the contact hole 32, forming a tungsten film on the barrier film 31 by CVD or the like in such a manner as to fill in the contact hole 32, and then removing the unneeded portions of the tungsten film and the barrier film which are located on the insulating film 31 by CMP or an etch-back process. The plug 33 is electrically connected to one of the source and drain of the MISFET Qn2 of the phase change memory.

Figure 10:
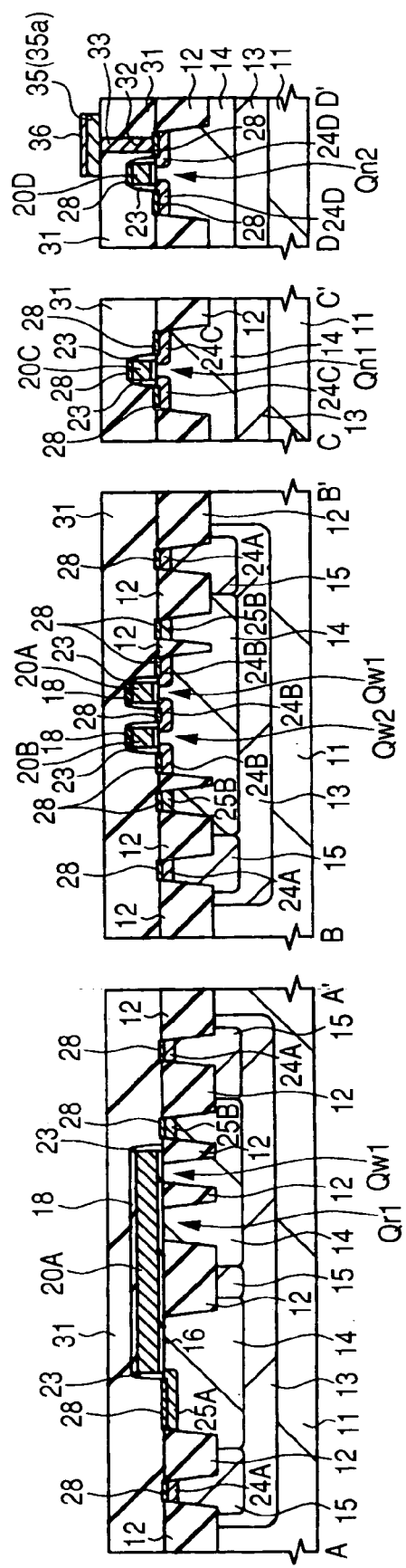
FIG. 10 is a main-portion cross-sectional view of the semiconductor device in the manufacturing step subsequent to that shown in FIG. 9.

Next, as shown in FIG. 10, a chalcogenide film (chalcogenide layer) 35a is formed over the insulating film 31 in which the plug 33 has been buried. Then, a metal film (metal layer or electrode layer) 36 is formed on the chalcogenide film 35a. The chalcogenide film 35a is a material film (semiconductor film) capable of a transition (phase change) between the two states which are the crystalline state and the amorphous (non-crystalline) state and made of a material (semiconductor) containing a chalcogen element (S, Se, or Te), i.e., a chalcogenide (chalcogenide semiconductor or chalcogenide material). The chalcogenide film 35a can be formed from, e.g., GeSbTe (e.g., $Ge_2Sb_2Te_5$), AgInSbTe, or the like. To enhance the adherence (adhesion) of the chalcogenide film 35a, a Ti (titanium) film or the like can also be formed on either or each of the upper and lower surfaces of the chalcogenide film 35a.

Next, the metal film 36 and the chalcogenide film 35a are patterned by dry etching using a photoresist film (not shown) patterned by a photolithographic technique as an etching mask. The patterned chalcogenide film 35a forms the phase change film (phase change layer or chalcogenide layer) 35 of the phase change memory. The phase change film 35 is formed to be connected to the plug 33 such that it is electrically connected to one of the source and drain (n-type semiconductor region 24D) of the MISFET Qn2 in the phase change memory region 2 via the plug 33. The metal film 36 as the electrode remains on the phase change film 35. The phase change film 35 can also be formed from a material other than a chalcogenide provided that it is capable of a transition (phase change) between the two states which are the crystalline state and the amorphous (non-crystalline) state. However, by forming the phase change film 35 from a chalcogenide (chalcogenide-based material), the phase change film 35 can be formed more stably.

In this manner, a phase change memory as shown in the portion denoted by the reference letters D and D' is formed in the phase change memory region 2.

Figure 11:
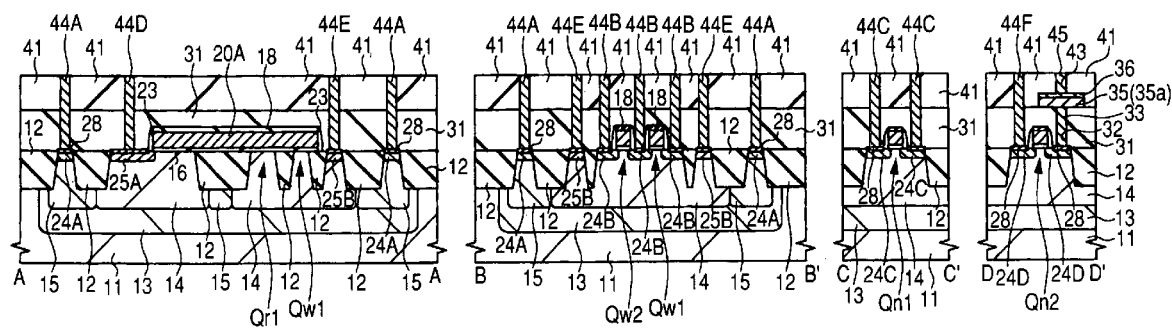
FIG. 11 is a main-portion cross-sectional view of the semiconductor device in the manufacturing step subsequent to that shown in FIG. 10.
Figure 12:
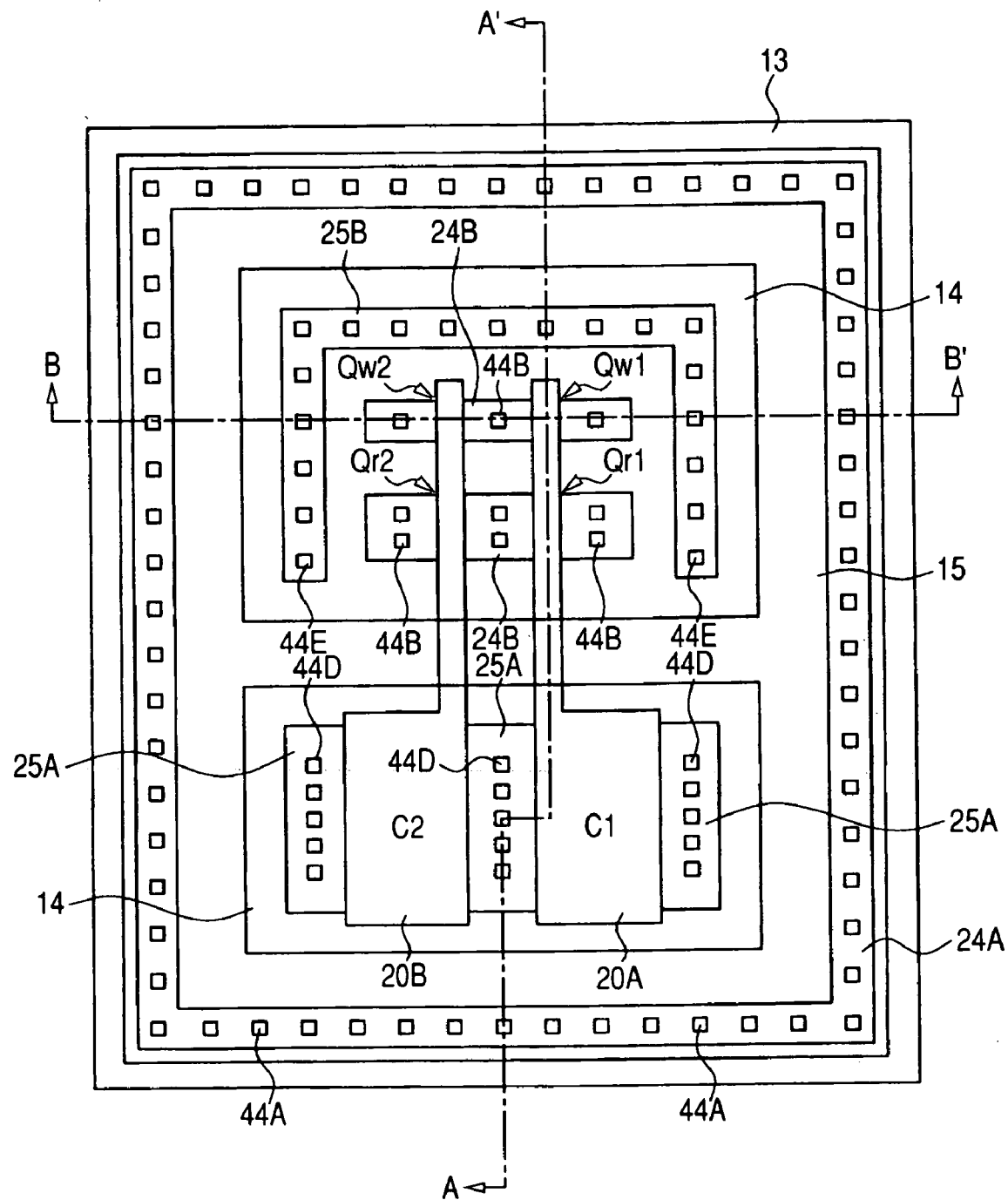
FIG. 12 is a main-portion plan view of the semiconductor device in the same manufacturing step as shown in FIG. 11.

Next, as shown in FIGS. 11 and 12, an insulating film 41 is formed on the insulating film 31 to cover the patterned metal film 36 and phase change film 35. The insulating film 41 is composed of, e.g., a silicon oxide film or the like.

Next, by using a photoresist film (not shown) as an etching mask, dry etching is performed with respect to the insulating films 41 and 31, thereby forming respective contact holes reaching the n-type semiconductor regions 24A, 24B, 24C, and 24D and the p-type semiconductor regions 25A and 25B, while dry etching is performed with respect to the insulating film 41 in the phase change memory region 2, thereby forming a through hole (contact hole) 43 reaching the metal film 36.

Next, plugs 44A to 44F made of tungsten (W) or the like are formed in the contact holes formed in the insulating films 41 and 31, while a plug 45 made of tungsten (W) or the like is formed in the through hole 43 formed in the insulating film 41. The plugs 44A to 44F and 45 can be formed by, e.g., forming a barrier film (e.g., a titanium nitride film) over the insulating film 41 including the insides of the contact holes formed in the insulating films 41 and 31 and the inside of the through hole 43 formed in the insulating film 41, forming a tungsten film by CVD or the like on the barrier film in such a manner as to fill in the contact holes and the through hole 43, and then removing the unneeded portions of the tungsten film and the barrier film which are located on the insulating film 41 by CMP, an etch-back process, or the like.

The plug 44A reaches the silicide layer 28 on the n-type semiconductor region 24A. The plug 44B reaches the silicide layer 28 on the n-type semiconductor region 24B. The plug 44C reaches the silicide layer 28 on the n-type semiconductor region 24C. The plug 44D reaches the silicide layer 28 on the p-type semiconductor region 25A. The plug 44E reaches the silicide layer 28 on the p-type semiconductor region 25B.

In the phase change memory region 2, the plug 45 is electrically connected to one of the source and drain (each composed of the silicide layer 28 on the n-type semiconductor region 24D) of the MISFET Qn2 via the metal film 36, the phase change film 35, and the plug 33. In the phase change memory region 2, the plug 44F is electrically connected to the other of the source and drain (each composed of the silicide layer 28 on the n-type semiconductor region 24D) of the MISFET Qn2.

Figure 13:
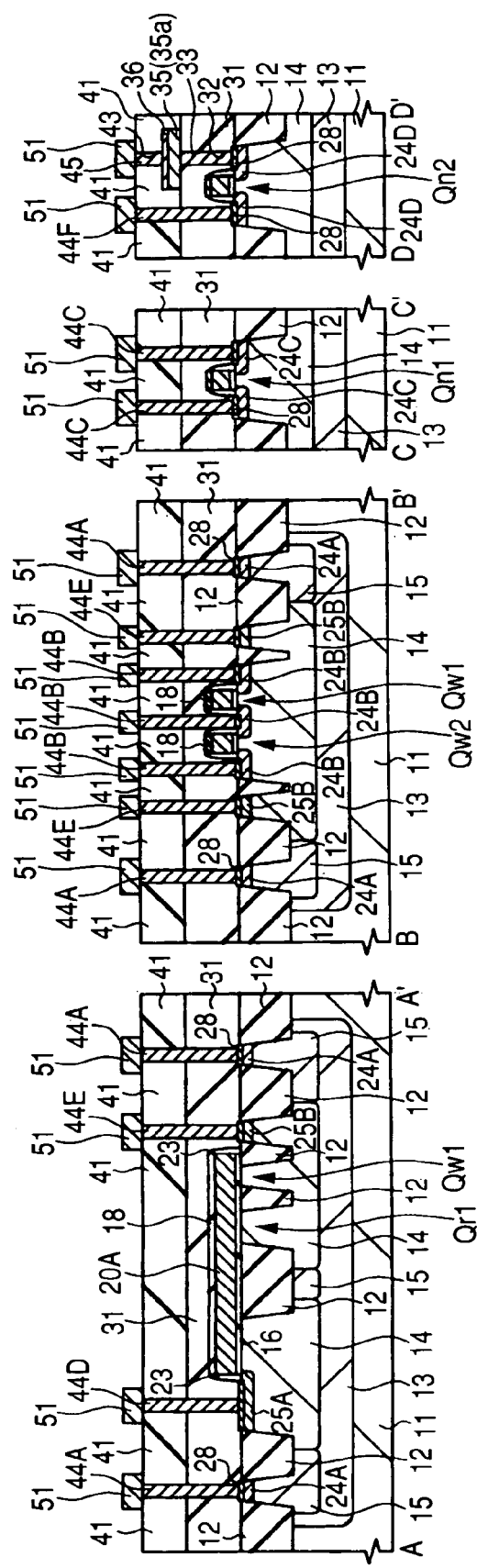
FIG. 13 is a main-portion cross-sectional view of the semiconductor device in the manufacturing step subsequent to that shown in FIG. 11.

Next, as shown in FIG. 13, wiring (first wiring layer) 51 is formed on the insulating film 41 in which the plugs 44A to 44F and 45 have been buried. For example, a barrier conductor film (e.g., a titanium film, a titanium nitride film, or a multilayer film thereof), an aluminum film, and a barrier conductor film (e.g., a titanium film, a titanium nitride film, or a multilayer film thereof) are formed successively by sputtering or the like over the insulating film 41 in which the plugs 44A to 44F and 45 have been buried and then patterned by using a photolithographic technique, a dry etching technique, and the like so that the wiring 51 is formed successfully. The wiring 51 is not limited to aluminum wiring as described above and can be variously modified. For example, the wiring 51 can also be, e.g., tungsten wiring or copper wiring (buried copper wiring formed by, e.g., a damascene process). Thereafter, interlayer insulating films, upper wiring layers, and the like are further formed, though the description thereof will be omitted herein. In the second and subsequent wiring layers, wiring can also be buried copper wiring formed by a damascene process.

Thus, the semiconductor integrated circuit (semiconductor element) including the nonvolatile memory of the phase change type (phase change memory in the phase change memory region 2) and the nonvolatile memory of the non-phase change type (nonvolatile memory in the electric fuse region 7) can be formed in the substrate 11.

On the other hand, the phase change memory (phase change film 35) is formed in a layer different from that of the nonvolatile memory (nonvolatile memory in the electric fuse region 7) as an electric fuse element. In contrast to the nonvolatile memory as the electric fuse element which can be formed in the same step as the n-channel MISFET Qn1 in the peripheral circuit region and therefore allows the simplification of the manufacturing steps, the phase change memory (phase change film 35) has a structure different from that of the nonvolatile memory mentioned above and cannot allow the simplification of the manufacturing steps. Accordingly, the phase change memory is formed in a layer higher than that of the nonvolatile memory cells as the electric fuse elements.

Figure 14:
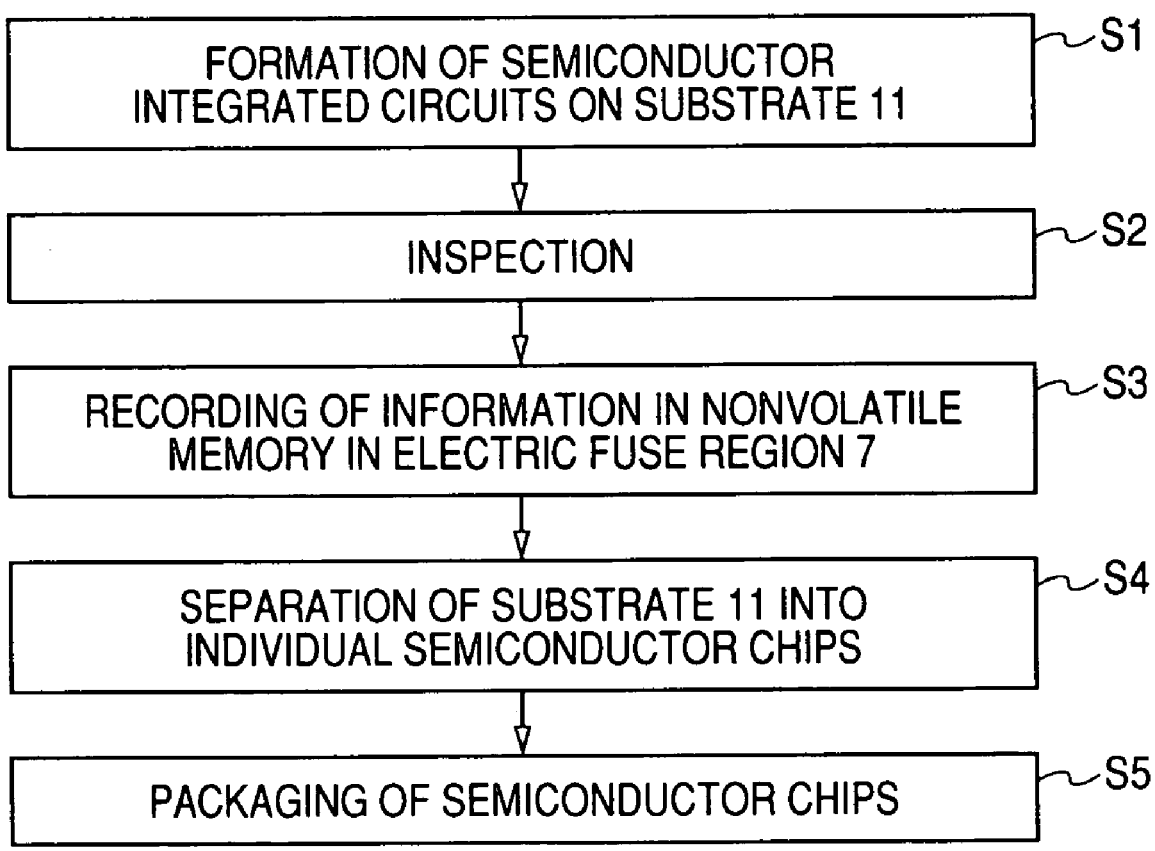
FIG. 14 is a step flow chart showing the manufacturing steps for the semiconductor device according to the first embodiment.

A description will be given next to the steps after the semiconductor integrated circuit is formed in the substrate (semiconductor substrate or semiconductor wafer) 11 as described above. FIG. 14 is a step flow chart showing the manufacturing steps for the semiconductor device according to the present embodiment.

After a desired semiconductor integrated circuit including the nonvolatile memory of the phase change type (phase change memory in the phase change memory region 2) and the nonvolatile memory of the non-phase change type (non-volatile memory in the electric fuse region 7) is formed in the substrate (semiconductor substrate or semiconductor wafer) 11 in a manner as shown in FIGS. 2 to 13 (Step S1), an inspection (testing or wafer inspection) step such as a probe inspection is performed (Step S2). Then, information (data) is recorded (stored, written, or held) in the nonvolatile memory in the electric fuse region 7 in accordance with the result of the inspection in Step S2 (Step S3). The recording of the data in Step 3 may also be performed during the inspection step of Step S2.

In Step S3, the recording of information is performed through charge injection or charge release to or from the charge accumulation region (which is the gate electrodes 20A and 20B) of the nonvolatile memory formed in the electric fuse region 7.

Examples of the information to be recorded in the nonvolatile memory in the electric fuse region 7 include an address at which an effective (in-use) element used during trimming (characteristic trimming) in the semiconductor device is located, an address (relief address data) at which an effective memory cell (faultless memory cell) is located to relieve a memory (e.g., a memory in the RAM region 3), the manufacturing number of the semiconductor device, and the history (manufacturing history) of the semiconductor device. Thus, the trimming data, the memory relief information, and the like can be recorded in the nonvolatile memory in the electric fuse regions 7 in Step S3.

When the information to be recorded in the nonvolatile memory cells in the electric fuse region 7 is information (data) which is based on the result of the inspection in the inspection step of Step S2, such as the characteristic trimming data and the relief address data, Step S3 (the recording of information in the nonvolatile memory cells in the electric fuse region 7) is performed after Step S2 (inspection step) or during Step S2 (inspection step) as described above.

When the information to be recorded in the nonvolatile memory cells in the electric fuse region 7 is information (data) which is not based on the result of the inspection in the inspection step of Step S2, such as the manufacturing number and history of the semiconductor device, Step S3 (the recording of information in the nonvolatile memory cells in the electric fuse region 7) may be performed after Step S2 (inspection step) or during Step S2 (inspection step) as described above, but Step S3 (the recording of information in the nonvolatile memory cells in the electric fuse region 7) may also be performed before Step S2 (inspection step) by changing the sequence of Steps S2 and S3. Alternatively, Step S2 (inspection step) may also be omitted.

Although information is recorded in the nonvolatile memory cells in the electric fuse region 7 in Step S3 in the present embodiment, information is not recorded (stored, written, held) in the phase change memory (phase change memory in the phase change memory region 2).

Next, the substrate 11 is cut by dicing or the like into separate pieces corresponding to individual semiconductor chips so that the semiconductor devices 1 as a separate piece of semiconductor chips are obtained (Step S4). FIG. 1 shows one of the semiconductor devices 1 as the separate pieces of semiconductor chips thus obtained.

Next, each of the semiconductor devices (semiconductor chips) 1 is packaged (semiconductor packaging) (Step S5). Specifically, a semiconductor package (corresponding to a semiconductor device 1a which will be described later) is assembled (manufactured) by using the semiconductor device 1 as the separate piece of semiconductor chip.

By thus inspecting the elements formed in the semiconductor substrate 11 in Step S2 and recording information (data) including trimming data and the memory relief information in Step 3 in accordance with the result of the inspection in the nonvolatile memory in the electric fuse region 7, the result of the inspection in Step S2 can effectively be reflected even after the packaging step of Step 5. This allows an improvement in the performance (characteristic) of the semiconductor device (semiconductor chip and the semiconductor package using the same) and also allows an improvement in the manufacturing yield thereof.

Figure 15:
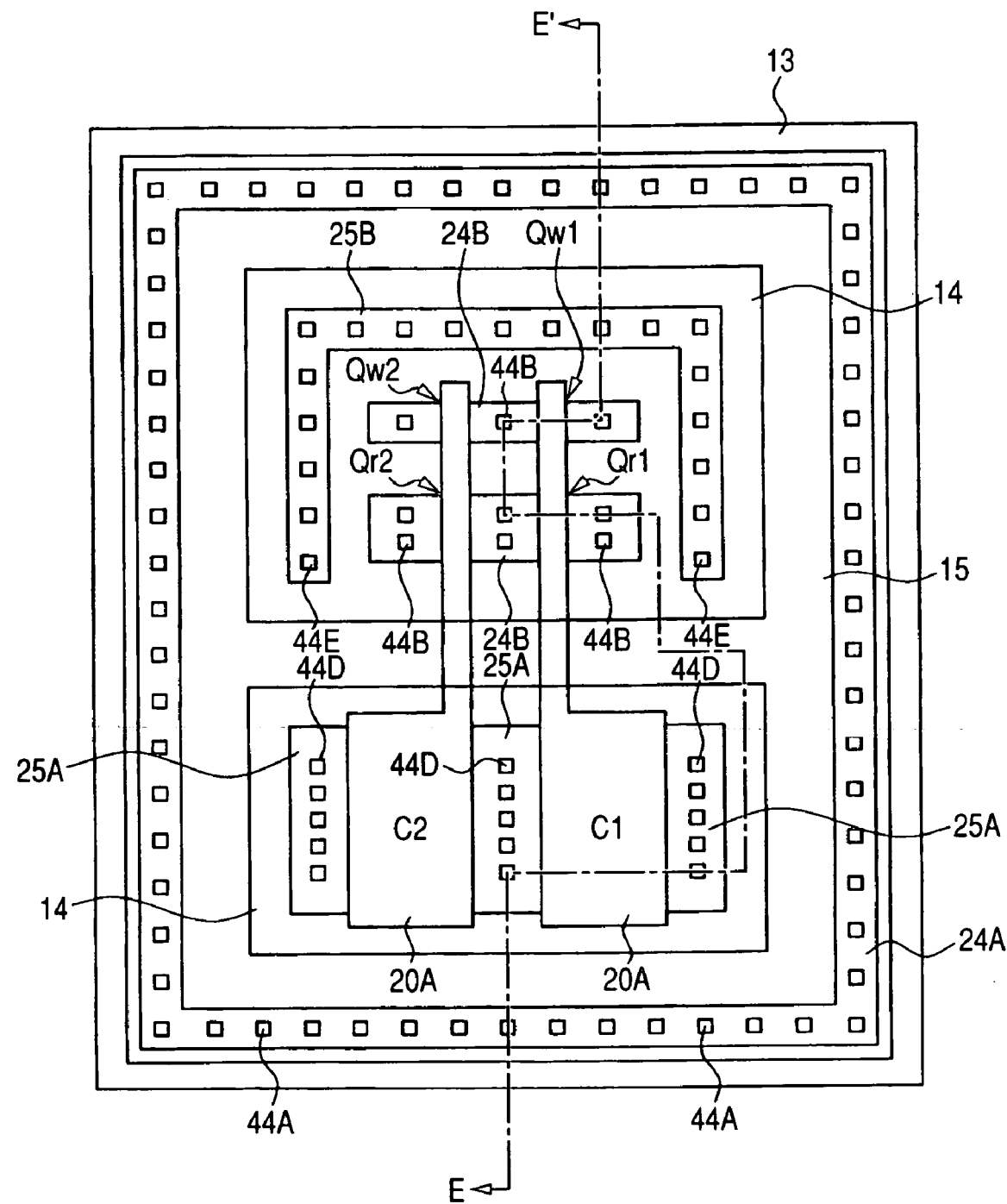
FIG. 15 is a main-portion plan view of the semiconductor device according to the first embodiment.
Figure 16:
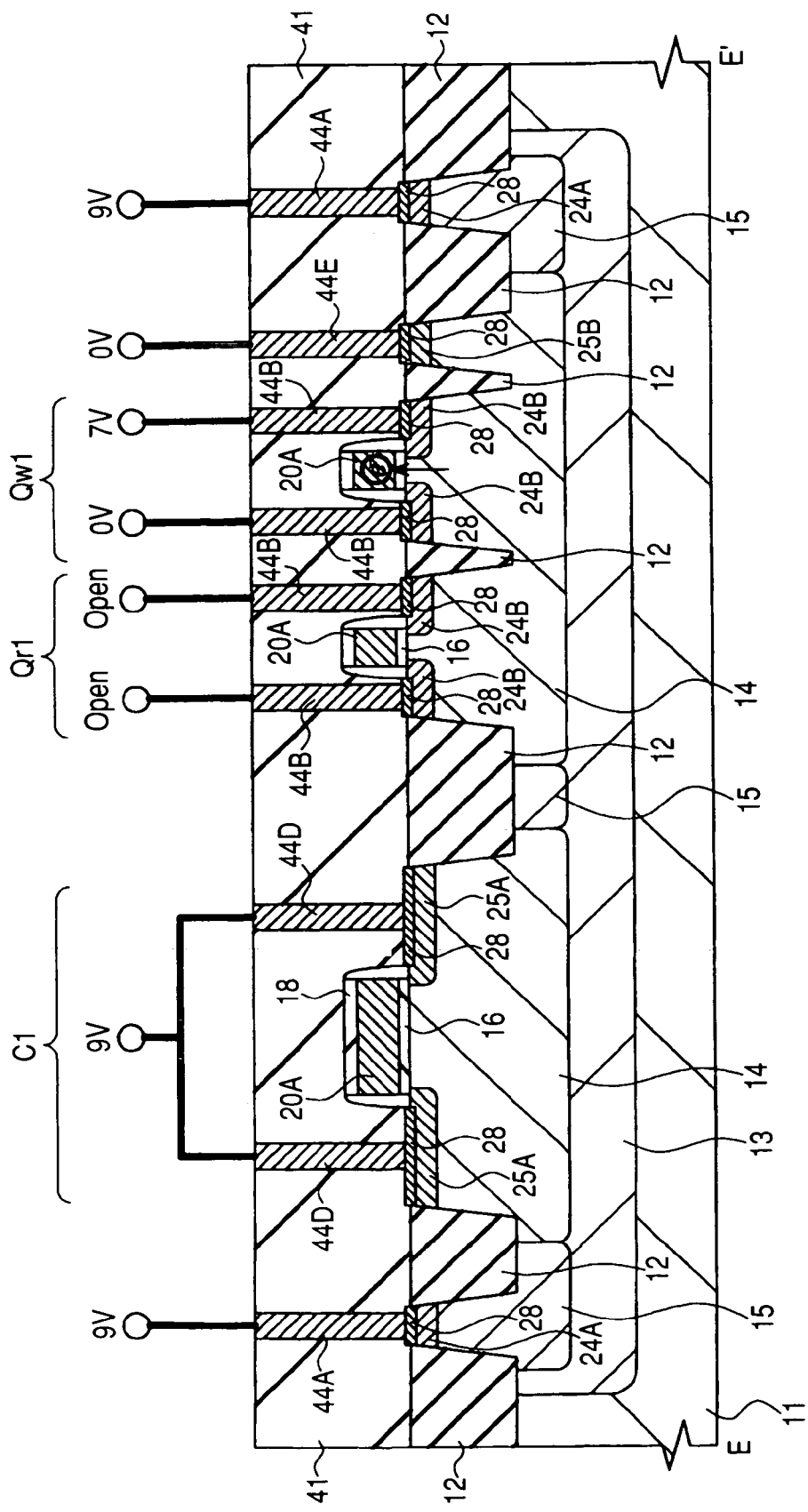
FIG. 16 is a main-portion cross-sectional view illustrating a data write operation to a nonvolatile memory in the electric fuse region of the semiconductor device according to the first embodiment.
Figure 17:
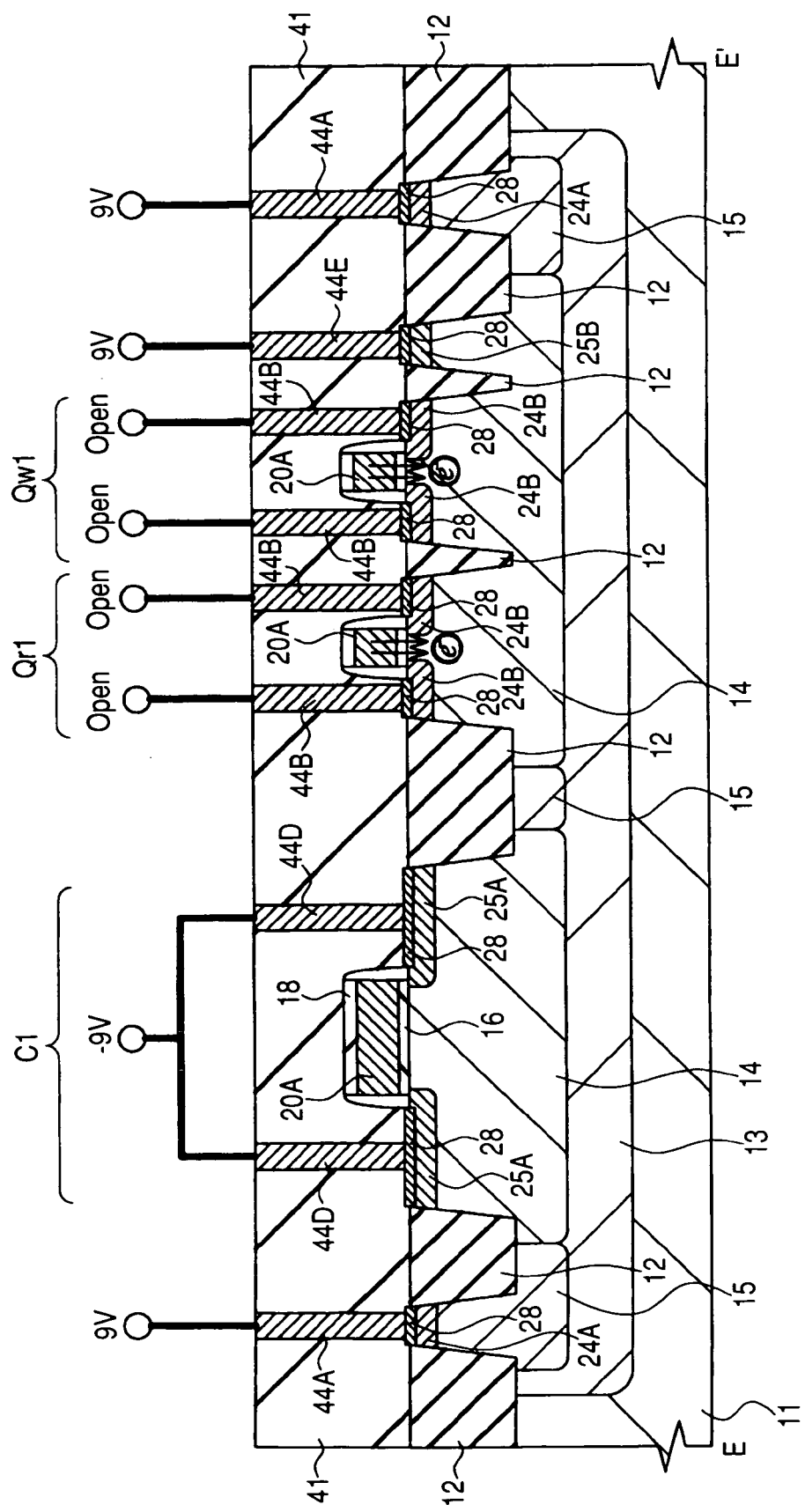
FIG. 17 is a main-portion cross-sectional view illustrating a data erase operation to the nonvolatile memory in the electric fuse region of the semiconductor device according to the first embodiment.
Figure 18:
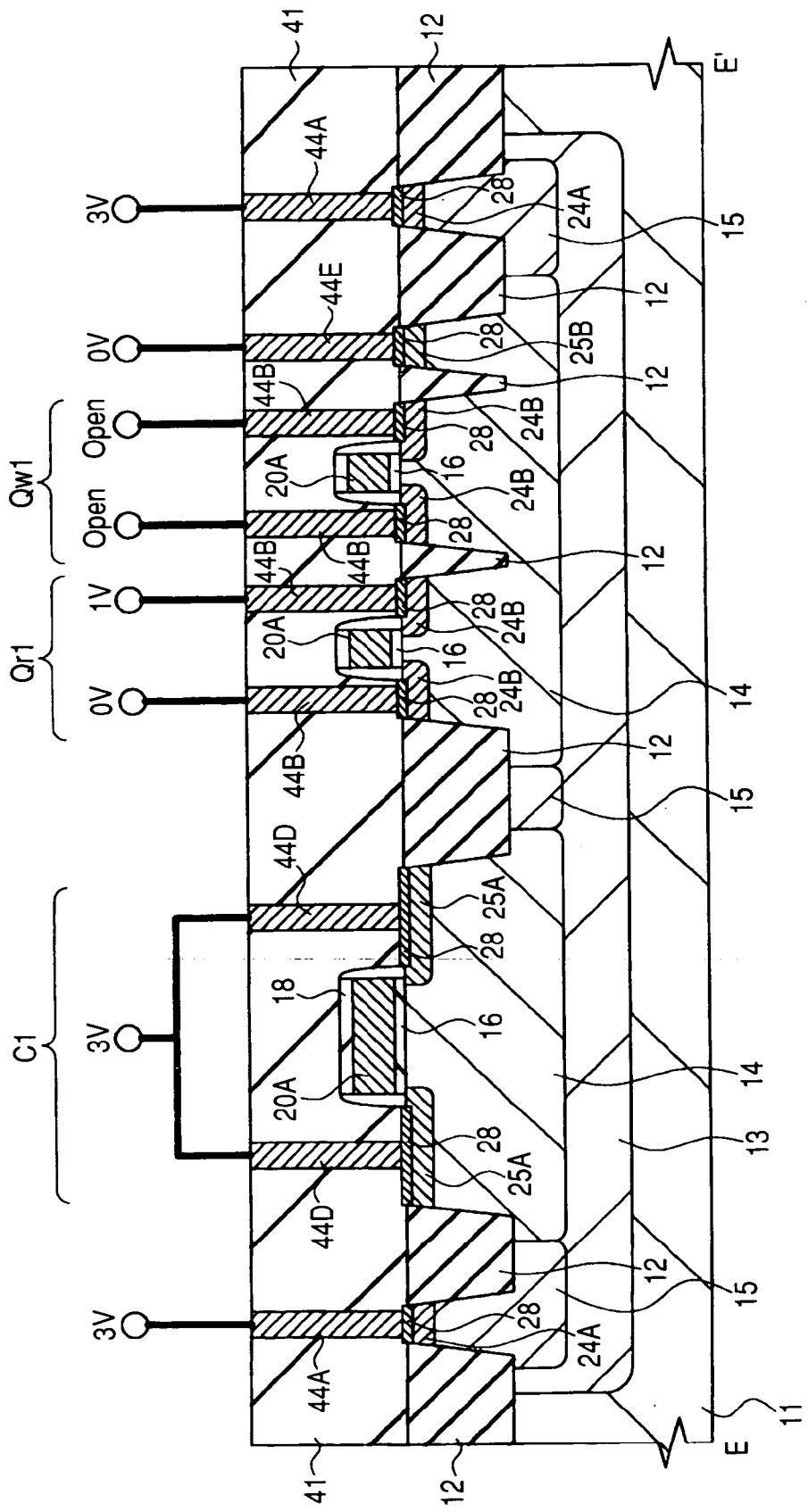
FIG. 18 is a main-portion cross-sectional view illustrating a data read operation to the nonvolatile memory in the electric fuse region of the semiconductor device according to the first embodiment.

A description will be given next to the individual operations of writing (recording), erasing, and reading information (data) performed with respect to the nonvolatile memory formed in the electric fuse region 7 according to the present embodiment with reference to FIGS. 15 to 18. FIG. 15 is a main-portion plan view of the memory cell region in the electric fuse region 7. FIGS. 16 to 18 show cross sections along the line E-E' of FIG. 18. In FIGS. 16 to 18, the depiction of the wiring 51 is omitted for clarity of description.

First, during the writing of data, as shown by way of example in FIG. 16, 9 V is applied to the n-type well 15 (n-type semiconductor isolation region 13), 0 V is applied to the p-type semiconductor region 25B (p-type well 14 formed with the MISFETs Qw1, Qw2, Qr1, and Qr2), 9 V is applied in a forward direction to the p-type semiconductor region 25A (p-type well 14 formed with the capacitor elements C1 and C2), 7 V is applied to one of the source and drain (n-type semiconductor regions 24B) of each of the MISFETs Qw1 and Qw2 for writing and erasing data, 0 V is applied to the other thereof, and an open-circuit potential is provided at each of the respective sources and drains (n-type semiconductor regions 24B) of the MISFETs Qr1 and Qr2 for reading data. As a result, channel hot electrons (e⁻) are injected into the gate electrode 20A of each of the MISFETs Qw1 and Qw2 for writing and erasing data, whereby the writing of data is performed. This enables the recording of data (information) in the nonvolatile memory cells in the electric fuse region 7 in Step S3.

During the erasing of data, as shown by way of example in FIG. 17, 9 V is applied to the n-type well 15 (n-type semiconductor isolation region 13), 9 V is applied to the p-type semiconductor region 25B (p-type well 14 formed with the MISFETs Qw1, Qw2, Qr1, and Qr2), −9 V is applied in a reverse direction to the p-type semiconductor region 25A (p-type well 14 formed with the capacitor elements C1 and C2, and an open-circuit potential is provided at each of the respective sources and drains (n-type semiconductor regions 24B) of the MISFETs Qw1 and Qw2 for writing and erasing data and the MISFETs Qr1 and Qr2 for reading data. Since the area occupied by each of the capacitor electrodes (gate electrodes 20A and 20B) of the capacitor elements C1 and C2 is larger than the area occupied by each of the capacitor electrodes (gate electrodes 20A and 20B) forming the gate capacitances of the MISFETs Qw1 and Qw2 (see FIG. 15 and the like), the capacitances of the capacitor elements C1 and C2 are larger than the gate capacitances (formed between the gate electrodes 20A and 20B and the channels of the MISFETs Qw1 and Qw2) of the MISFETs Qw1 and Qw2. Accordingly, the voltages applied to the gate capacitances of the MISFETs Qw1 and Qw2 are higher than the voltages applied to the capacitor elements C1 and C2. As a result, electrons (e⁻) are released from the gate electrodes 20A to the p-type well 14 by FN tunneling in the MISFETs Qw1 and Qw2 for writing and erasing data and in the MISFETs Qr1 and Qr2 for reading data, whereby the erasing of data is performed.

During the reading of data, as shown by way of example in FIG. 18, 3 V is applied to the n-type well 15 (n-type semiconductor isolation region 13), 0 V is applied to the p-type semiconductor region 25B (p-type well 14 formed with the MISFETs Qw1, Qw2, Qr1, and Qr2), 3 V is applied to the p-type semiconductor region 25A (p-type well 14 formed with the capacitor elements C1 and C2), an open-circuit potential is provided at each of the respective sources and drains (n-type semiconductor regions 24B) of the MISFETs Qw1 and Qw2 for writing and erasing data, 1 V is applied to one of the source and drain (n-type semiconductor regions 24B) of each of the MISFETs Qr1 and Qr2 for reading data, and 0 V is applied to the other thereof, whereby the MISFETs Qr2 and Qr2 for reading data are turned ON.

Although the present embodiment has shown by way of example the case where the MISFETs (Qw1 and Qw2) for writing and erasing data and the MISFETs (Qr1 and Qr2) for reading data are both formed in the electric fuse region 7, it is also possible to omit either of the MISFETs Qw1 and Qw2 and either of the MISFETs Qr1 and Qr2 and perform each of the data writing, erasing, and reading operations by using one MISFET.

Figure 19:
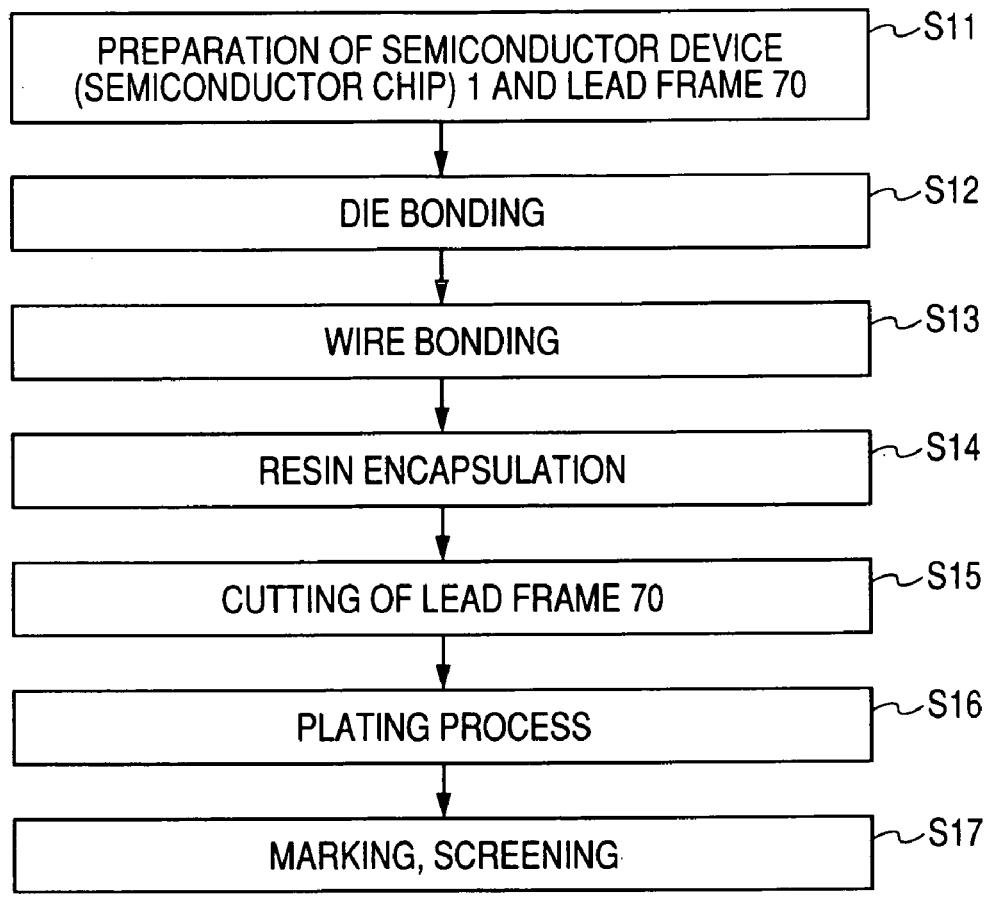
FIG. 19 is a step flow chart showing assembling steps for the semiconductor device according to the first embodiment.

A detailed description will be given next to the foregoing step of packaging the semiconductor device (semiconductor chip) 1 of Step S5, i.e., the step of assembling the semiconductor device 1a in the form of a semiconductor package by using the semiconductor device 1 as the semiconductor chip. FIG. 19 is a step flow chart showing assembling steps (packaging steps) for the semiconductor device 1a in the form of a semiconductor package. FIGS. 20 to 24 are cross-sectional views illustrating the steps of assembling (manufacturing) the semiconductor device (semiconductor package) 1a by packaging the semiconductor device (semiconductor chip) 1.

Figure 20:
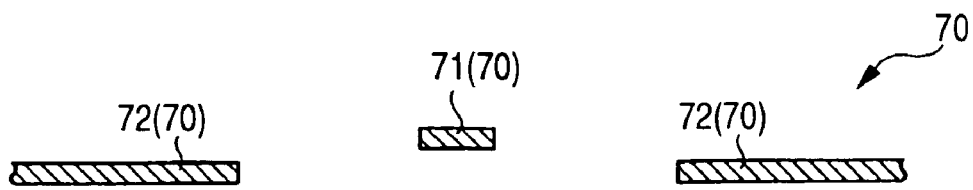
FIG. 20 is a cross-sectional view showing the assembling step for the semiconductor device according to the first embodiment.

First, as shown in FIG. 20, the semiconductor device 1 as the semiconductor chip is prepared as described above (Steps S1 to S4) and a lead frame 70 for manufacturing the semiconductor device 1a is prepared (Step S11). The lead frame 70 is made of a conductor material (metal material) such as, e.g., copper, a copper alloy, or a 42-alloy. The lead frame 70 has a tab 71 for mounting the semiconductor chip (semiconductor device 1) and a plurality of lead portions 72. Each of the lead portions 72 is disposed to have one end thereof opposing the tab 71 in spaced apart relation and the other end thereof connected to the framework of the lead frame 70. The tab 71 is held or supported by the framework of the lead frame 70 via suspension leads (not shown).

Figure 21:
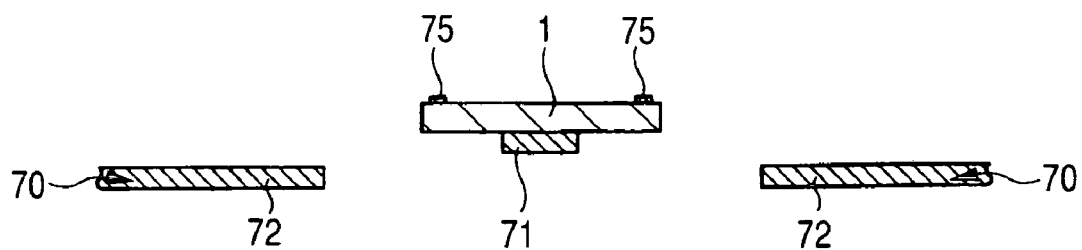
FIG. 21 is a cross-sectional view of the semiconductor device in the assembling step subsequent to that shown in FIG. 20.

Next, as shown in FIG. 21, a die bonding step is performed to adhere (bond) the semiconductor device 1 as the semiconductor chip onto the tab 71 of the lead frame 70 via a bonding material (not shown) (Step S12). For example, a silver paste, an insulating paste, or the like can be used as the bonding material for the semiconductor chip.

Figure 22:
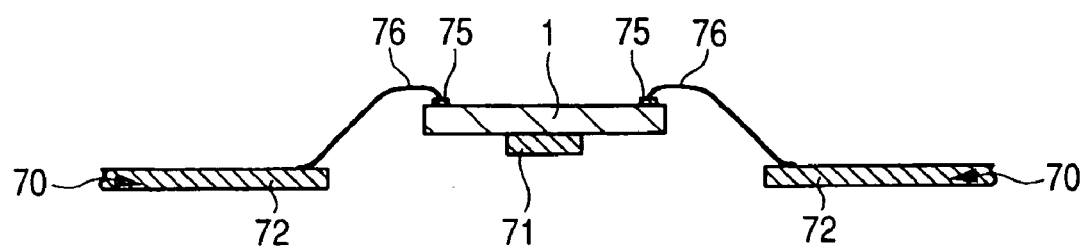
FIG. 22 is a cross-sectional view of the semiconductor device in the assembling step subsequent to that shown in FIG. 21.

Next, as shown in FIG. 22, a wire bonding step is performed to provide electrical connections between the plurality of electrodes (bonding pads) 75 of the semiconductor device 1 as the semiconductor chip and the respective upper surfaces of the plurality of lead portions 72 of the lead frame 70 via a plurality of bonding wires 76 (Step S13).

When wire bonding is performed in Step S13, it is preferred for the enhanced connection strength of each of the bonding wires 76 to provide the electrical connections between the electrodes 75 of the semiconductor device 1 and the lead portions 72 via the bonding wires 76 after heating each of the lead portions 72 as regions to be wire bonded and the adjacent regions of the electrodes 75 of the semiconductor device 1 to a specified temperature appropriate for wire bonding. For example, wire bonding is performed, while heating the tab 71 and the lead portions 72. Consequently, in the wire bonding step, the semiconductor device 1 is also heated disadvantageously.

Figure 23:
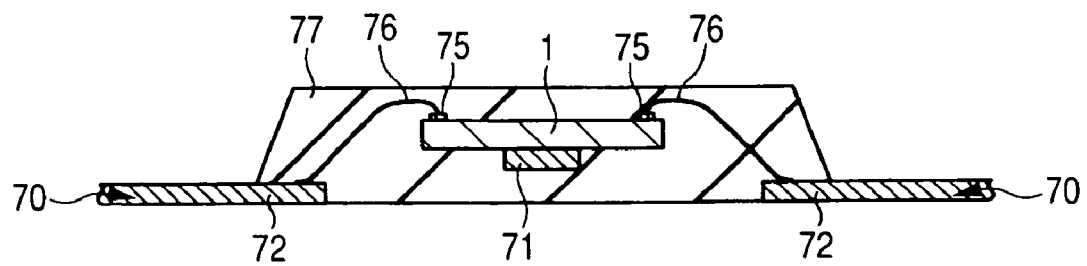
FIG. 23 is a cross-sectional view of the semiconductor device in the assembling step subsequent to that shown in FIG. 22.

Next, as shown in FIG. 23, a resin encapsulation step (encapsulation step or molding step such as, e.g., a transfer molding step) is performed to encapsulate the semiconductor device 1 and the bonding wires 76 in a molded resin portion (molded resin) 77 (Step S14). That is, the semiconductor chip (semiconductor device 1) is encapsulated in a resin. The molded resin portion 77 is made of a resin material such as, e.g., an epoxy resin or a silicone resin and may also contain a filler or the like.

When the molded resin portion 77 is formed in Step S14, the semiconductor device 1 placed on the tab 71 and the bonding wires 76 connected to the semiconductor device 1 are loaded in the cavity of a mold die (not shown), a material (resin material containing a filler or the like) for forming the molded resin portion 77 is injected in the cavity, and the material is cured so that the molded resin portion 77 is formed. In the case where a thermosetting resin material is used as a resin material for forming the molded resin portion 77, the resin material (also containing a filler or the like) is injected in the cavity of the mold die and then heated at a specified temperature for a specified time to be cured. In the heating step for curing the material for forming the molded resin portion 77, the semiconductor device 1 present in the material is also heated disadvantageously. In the case where a thermoplastic resin material is used as the resin material for forming the molded resin portion 77, the resin material (also containing the filler or the like) at a relatively high temperature is injected in the cavity of the mold die so that the semiconductor device 1 is also heated disadvantageously during the formation of the molded resin portion 77.

Figure 24:
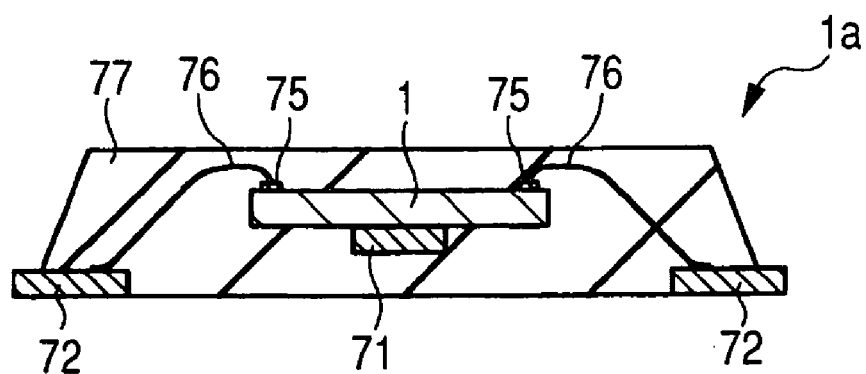
FIG. 24 is a cross-sectional view of the semiconductor device in the assembling step subsequent to that shown in FIG. 23.

Next, as shown in FIG. 24, the lead frame 70 is cut at a specified position to be separated into individual pieces (Step S15). After the cutting of the lead frame 70, the lead portions 72 protruding from the molded resin portion 77 can also be molded as necessary. In this manner, the individual separate pieces of semiconductor devices (semiconductor packages) 1a, i.e., the semiconductor devices 1a each in the form of a semiconductor package are obtained.

Next, a plating process is performed to form a plating layer (solder plating layer) on the exposed portions of the lead portions 72 of each of the semiconductor devices 1a (Step S16). The plating process can also be performed before the cutting of the lead frame 70 (i.e., before Step S15) with respect to the lead portions 72 exposed from the molded resin portion 77.

Next, a marking step and a screening step are performed (Step S17), Specifically, the manufacturing number and the like are marked on the upper surface of the molded resin portion 77 of the semiconductor device 1a and the semiconductor devices 1a are screened into conforming items and defective items. The semiconductor devices 1a determined as the conforming items in the screening step are shipped as products (semiconductor packages).

Although the present embodiment has described the case where the semiconductor package is manufactured by using the lead frame as the step of packaging the semiconductor device (semiconductor chip) 1 of Step S5, it is not limited thereto. Packaging can be performed by using various techniques. For example, the semiconductor package can also be manufactured by using a wiring substrate, a flexible wiring substrate, or the like instead of the lead frame and performing the die bonding of the semiconductor chip onto the wiring substrate or the flexible wiring substrate or the like in Step S5.

Figure 25:
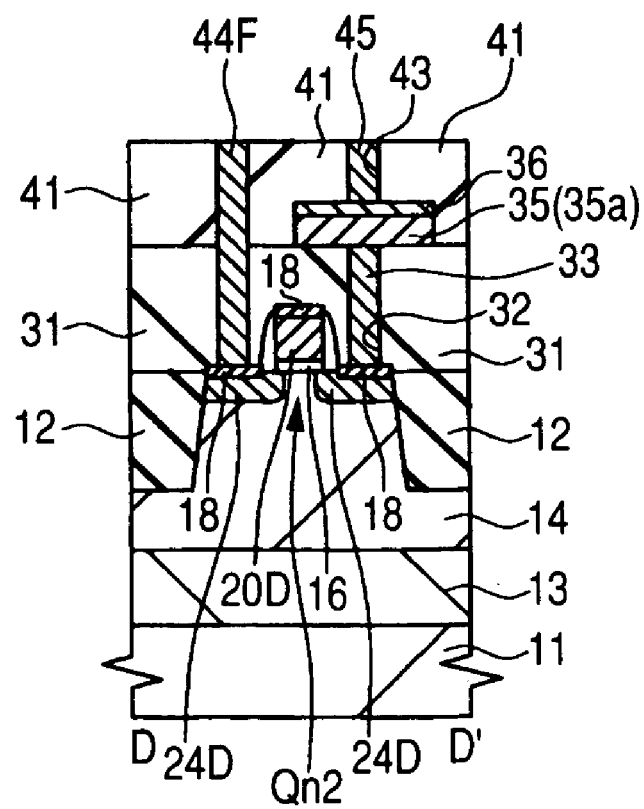
FIG. 25 is a main-portion cross-sectional view showing the structure of a phase change memory formed in the semiconductor device according to the first embodiment.
Figures 26, 27:
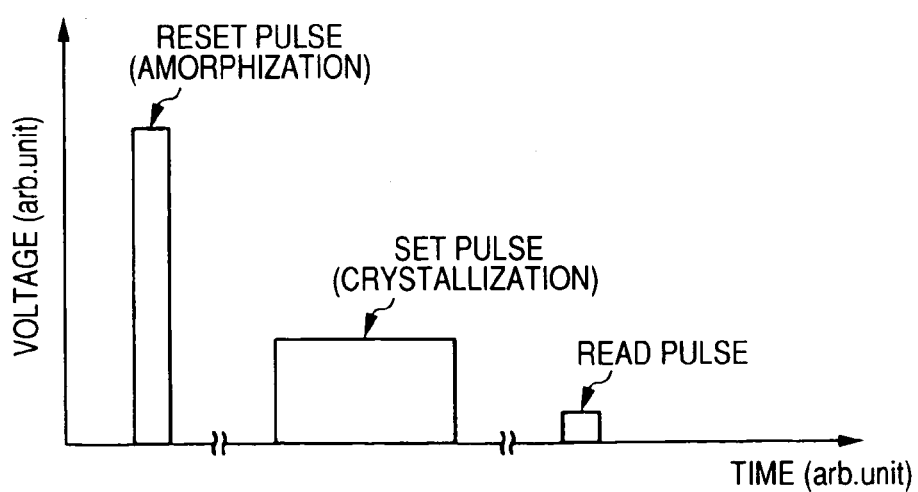
FIG. 26 is an illustrative view showing a correlation between the state of the phase change film of the phase change memory and the resistance of the phase change film.
FIG. 27 is a graph for illustrating the operation of the phase change memory.

A description will be given next to the operation of the phase change memory. FIG. 25 is a main-portion cross-sectional view showing a structure of the phase change memory formed in the semiconductor device 1. The cross section corresponding to the portion denoted by the reference letters D and D' of FIG. 11 is shown therein. As stated previously, the phase change memory (memory cell array thereof) is formed in the phase change memory region 2 of the semiconductor device 1. FIG. 26 is an illustrative chart (table) showing the correlation between the state (phase state) of the phase change film 35 of the phase change memory and the resistance of the phase change film 35.

As also shown in FIG. 25, the phase change memory has the phase change film 35 made of a phase change material (phase change substance) such as a chalcogenide-based material. The phase change film 35 is capable of a transition (phase change) between the two states which are the crystalline state and the amorphous state (non-crystalline state) and therefore functioning as a memory element. The phase change film 35 has different resistivities in the amorphous state and in the crystalline state. As shown in FIG. 26, the phase change film 35 has a high resistance (high resistivity) in the amorphous state and has a low resistance (low resistivity) in the crystalline state. For example, the resistivity of the phase change film 35 in the amorphous state is about 10 to 10000 times higher than the resistivity of the phase change film 35 in the crystalline state.

Such a phase change film 35 and the MISFET Qn2 as the memory cell transistor connected to the phase change film 35 constitute the phase change memory (memory cell thereof) shown in FIG. 25. The gate electrode 20 of the MISFET Qn2 is electrically connected to a word line (not shown). The upper surface of the phase change film 35 is electrically connected to a bit line (not shown) via the metal film 35 and the plug 45. The lower surface of the phase change film 35 is electrically connected to one of the source and drain of the MISFET Qn2 via the plug 33. A source line (not shown) is electrically connected to the other of the source and drain of the MISFET Qn2 via the plug 44F.

Although the present embodiment has shown the case where the n-channel MISFET Qn2 is used as the memory cell transistor of the phase change memory, a p-channel MISFET, a bipolar transistor, or the like can also be used instead of the n-channel MISFET Qn2 in another embodiment. However, a MISFET is used preferably in terms of achieving higher integration. Moreover, an n-channel MISFET Qn2 having a low channel resistance in the ON state is used preferably to a p-channel MISFET. A description will be given herein below to the operation in the case where the n-channel MISFET Qn2 is used as the memory cell transistor.

Figure 28:
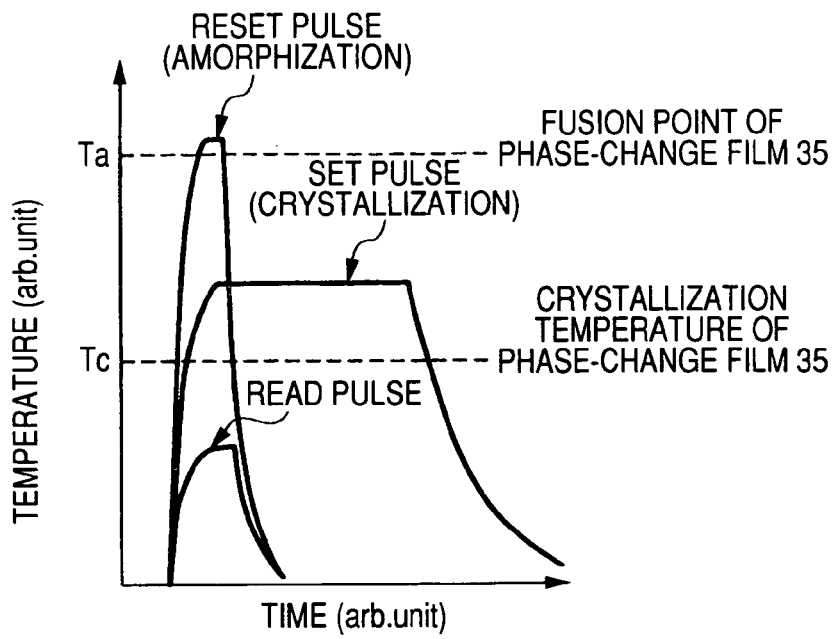
FIG. 28 is a graph for illustrating the operation of the phase change memory.

FIGS. 27 and 28 are graphs for illustrating the operation of the phase change memory. In the graph of FIG. 27, the ordinate axis corresponds to the voltage (in an arbitrary unit) of each of a reset pulse, a set pulse, and a read pulse applied to the phase change memory and the abscissa axis corresponds to the time (in an arbitrary unit). In the graph of FIG. 28, the ordinate axis corresponds to the temperature (in an arbitrary unit) of the phase change film 35 when each of the reset pulse, the set pulse, and the read pulse is applied to the phase change memory and the abscissa axis corresponds to the time (in an arbitrary unit).

During the reset operation for the phase change memory (the amorphization of the phase change film 35), a reset pulse as shown in FIG. 27 is applied to each of the metal film (electrode) 36 and the phase change film 35 via the bit line and the plug 45. As described above, the phase change film 35 is electrically connected to one of the source and drain of the MISFET Qn2 via the plug 33. A fixed potential (e.g., 0 V) is supplied to the other of the source and drain of the MISFET Qn2 via the source line and the plug 44F. A specified voltage is applied to the gate electrode 20D of the MISFET Qn2 via the word line. As the reset pulse, a relatively high voltage (e.g., about 3 V) is applied for a relatively short time (e.g., about 20 nsec (nanoseconds)). During the application of the reset pulse, a relatively large current flows and the temperature of the phase change film 35 increases to a level not less than the fusion point (amorphization temperature) of the phase change film 35, as shown in FIG. 28, so that the phase change film 35 is fused or amorphized. When the application of the reset pulse is completed, the phase change film 35 is rapidly cooled and brought into the amorphous state. The fusion point $T_a$ of the phase change film 35 is typically about 200° C., though it differs depending on the materials contained therein. The temperature range in which the phase change memory is capable of normal operation is typically about 150 to 200° C., though it differs depending on the materials contained in the phase change film 35.

During the set operation (the crystallization of the phase change film 35) for the phase change memory, a set pulse as shown in FIG. 27 is applied to each of the metal film 36 and the phase change film 35 via the bit line and the plug 45. A fixed potential (e.g., 0 V) is supplied to the other of the source and drain of the MISFET Qn2 via the source line and the plug 44F. A specified voltage is applied to the gate electrode 20D of the MISFET Qn2 via the word line. As the set pulse, a voltage (e.g., about 1 V) lower than the reset pulse is applied for a longer time (not shorter than the crystallization time, e.g., about 100 nsec) than the application time of the reset pulse. During the application of the set pulse, a current smaller than in the reset operation flows for a relatively long time and the temperature of the phase change film 35 increases to a level not less than the crystallization temperature $T_c$ of the phase change film 35 and less than the fusion point (amorphization temperature) $T_a$ thereof as shown in FIG. 28, so that the phase change film 35 is crystallized. When the application of the set pulse is completed, the phase change film 35 is cooled and brought into the crystalline state.

During the read operation for the phase change memory, a read pulse as shown in FIG. 27 is applied to each of the metal film 36 and the phase change film 35 via the bit line and the plug 45. A fixed potential (e.g., 0 V) is supplied to the other of the source and drain of the MISFET Qn2 via the source line and the plug 44F. A specified voltage is applied to the gate electrode 20D of the MISFET Qn2 via the word line. As the read pulse, a voltage (e.g., about 0.3 V) lower than the set pulse is applied for a time (e.g., about 20 nsec) shorter than the application time of the set pulse. The voltage of the read pulse is relatively low so that, even when the read pulse is applied, the temperature of the phase change film 35 is prevented from increasing to a level not less than the crystallization temperature $T_c$ of the phase change film 35. As a result, the phase state of the phase change film 35 does not change. When the phase change film 35 is in the crystalline state, the phase change film 35 has a relatively low resistance. When the phase change film 35 is in the amorphous state, on the other hand, the phase change film 35 has a relatively high resistance. Accordingly, the current flowing in the MISFET Qn2 when the read pulse is applied is relatively large when the phase change film 35 is in the crystalline state and is relatively small when the phase change film 35 is in the amorphous state. This allows the determination of data (whether the phase change film 35 is in the crystalline state or in the amorphous state) based on the magnitude of the flowing current.

By thus allowing the phase change film 35 to shift between the amorphous state and the crystalline state by the reset and set operations, it becomes possible to record (hold, store, or write) data in the phase change memory, use whether the phase change film 35 is in the amorphous state or in the crystalline state as the information stored in the phase change memory, and read the data (recorded information) recorded in the phase change memory therefrom by the read operation.

A detailed description will be given next to the effects of the present embodiment.

Information (data) is recorded (stored) in the phase change memory based on the phase state (whether the crystalline state or the amorphous state) of the phase change film 35. Accordingly, the phase change memory is relatively low in thermal retention resistance. When a thermal process at a temperature of, e.g., about 200° C. or more is performed, data may be evaporated. That is, when the semiconductor device (semiconductor device formed with the phase change memory) is heated after the recording of data in the phase change memory, the phase state of the phase change film 35 may change and the data recorded in the phase change memory may be lost (evaporated or changed).

Figure 29:
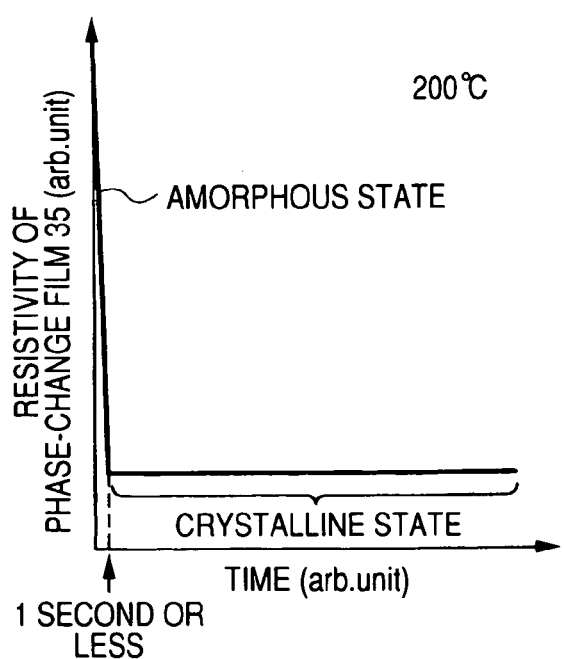
FIG. 29 is a graph showing a variation in the resistivity of the phase change film of the phase change memory when a thermal process at 200° C. is performed.

FIG. 29 is a graph schematically showing a variation in the resistivity of the phase change film 35 of the phase change memory when a thermal process at 200° C. is performed. In the graph of FIG. 29, the ordinate axis corresponds to the resistivity (in an arbitrary unit) of the phase change film 35 of the phase change memory and the abscissa axis corresponds to the time (in an arbitrary unit) elapsed after heating.

As shown in FIG. 29, the phase change film 35 in the amorphous state changes therefrom into the crystalline state after heated at 200° C. for a time of, e.g., not more than 1 second so that the resistivity thereof lowers. Accordingly, even when data is recorded in the phase change memory, the phase state of the phase change film 35 changes if a thermal process at about 200° C. is performed, so that the data recorded in the phase change memory is lost.

As a result of a study, the present inventors have found that, when a semiconductor chip is heated to a high temperature in the step (corresponding to Step S5 described above) of packaging the semiconductor chip to form the semiconductor package and when a phase change memory is formed in the semiconductor chip and data is stored in the phase change memory, the data stored in the phase change memory may be changed. In the packaging step (Step S5) for the semiconductor chip, the semiconductor chip (semiconductor device 1) is heated in, e.g., the wire bonding step (corresponding to Step S13 described above, the resin encapsulation step (corresponding to Step S14 described above), and the like. In the resin encapsulation step (corresponding to Step S14 described above), in particular, the semiconductor chip (semiconductor device 1) is heated disadvantageously to a relatively high temperature (e.g., about 100 to 300° C.).

Thus, in the present embodiment, the nonvolatile memory of the phase change type (phase change memory) and the nonvolatile memory of the non-phase change type are formed (embedded in mixed relation) in the same semiconductor device (semiconductor chip) 1. Specifically, the phase change memory is formed in the phase change memory region 2 of the semiconductor device 1, while the nonvolatile memory of the non-phase change type such as an EPROM or an EEPROM is formed in the electric fuse region 7 of the semiconductor device 1. By forming the phase change memory in the semiconductor device 1, a small-size, large-capacity, and high-speed memory can be implemented. In addition, the nonvolatile memory of the non-phase change type, such as an EPROM or an EEPROM, formed in the electric fuse region 7 is higher in thermal retention resistance than the phase change memory so that no data loss (evaporation) occurs in the thermal history in the semiconductor packaging step of Step S5.

Thus, it will be understood from the problem associated with the thermal retention resistance that the nonvolatile memory of the phase change type (phase change memory) is inappropriate for use as a fuse element. Accordingly, it is necessary to use a fuse element other than a phase change type as the fuse element.

Figures 30, 31:
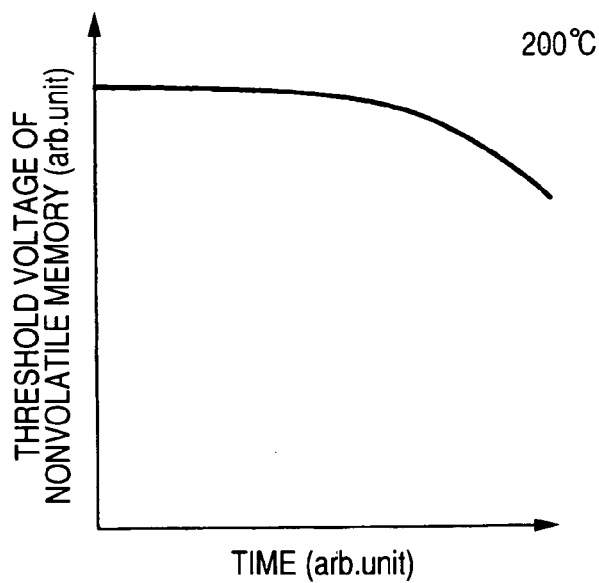
FIG. 30 is a graph showing a variation in the threshold voltage of the nonvolatile memory in the electric fuse region when a thermal process at 200° C. is performed.
FIG. 31 is an illustrative view showing a method of using the nonvolatile memory in the electric fuse region and the phase change memory in a phase change memory region.

FIG. 30 is a graph schematically showing a variation in the threshold voltage of the nonvolatile memory in the electric fuse region 7 when a thermal process at 200° C. is performed. In the graph of FIG. 30, the ordinate axis corresponds to the threshold voltage (in an arbitrary unit) of the nonvolatile memory in the electric fuse region 7 and the abscissa axis corresponds to the time (in an arbitrary unit) elapsed after heating. FIG. 31 is an illustrative chart (table) showing a method of using the nonvolatile memory in the electric fuse region 7 and the phase change memory in the phase change memory region 2.

The nonvolatile memory in the electric fuse region 7 is of the non-phase change type (such as an EPROM or an EEPROM) which stores information through charge injection or charge release to or from the charge accumulation region. The information stored in the memory can be read based on the different threshold voltages during charge accumulation and during charge release (during a non-accumulation time). As shown in FIG. 30, the nonvolatile memory in the electric fuse region 7 is higher in thermal retention resistance than the phase change memory shown in FIG. 29 so that the threshold voltage thereof does not change significantly even when a thermal process at about 200° C. is performed. As a result, the information recorded in the nonvolatile memory in the electric fuse region 7 is not lost even when a thermal process at about 200° C. is performed. Therefore, in the thermal history (thermal process or heating step) in the semiconductor packaging step of Step 5, the information recorded (held, stored, or written) in the nonvolatile memory in the electric fuse region 7 is not lost (evaporated or changed).

As shown in FIG. 31, the present embodiment does not record (store, hold, or write) information (data) in the phase change memory of the phase change memory region 2 before the packaging step of Step S5 but can record (store, hold, or write) information (data) therein by freely using the phase change memory of the phase change memory region 2 after the packaging step of Step S5. As shown in FIG. 31, the present embodiment can also record (store, hold, or write) information (data) in the nonvolatile memory in the electric fuse region 7 before the packaging step of Step S5 and rewrite or not rewrite the information recorded in the nonvolatile memory in the electric fuse region 7 after the packaging step of Step S5 as necessary.

Even though data is recorded in the phase change memory formed in the phase change memory region 2 before the package step of Step S5, the data recorded in the phase change memory may be lost in the packaging step (particularly in the resin encapsulation step of Step S14 included therein) of Step S5. Therefore, the present embodiment does not record data in the phase change memory formed in the phase change memory region 2 before (particularly before the resin encapsulation step of Step S14) the packaging step of Step S5. Since the packaging step (particularly the resin encapsulation step of Step S14) of Step S5 is performed without recording data in the phase change memory of the phase change memory region 2, the data recorded in the phase change memory of the phase change memory region 2 can be prevented from being lost in the packaging step of Step S5. After the packaging step of Step S5 (particularly after the resin encapsulation step of Step S14), the phase change memory of the semiconductor device 1 in the semiconductor device 1a in the form of a semiconductor package can be used freely and desired data can be recorded in the phase change memory of the phase change memory region 2. In short, data is not recorded in the phase change memory before semiconductor packaging and the writing, erasing, and reading of data in and from the phase change memory is performed after the semiconductor packaging.

In the present embodiment, information (data) desired to be recorded before the packaging step of Step S5, i.e., an address at which an effective (in-use) element used during, e.g., trimming in the semiconductor device is located, an address (relief address data) at which an effective memory cell for memory relief is located, the manufacturing number of the semiconductor device, or the history of the semiconductor device is recorded in Step S3 prior to the packaging step of Step S5 in a nonvolatile memory of the non-phase change type (such as, e.g., an EPROM or EEPROM), i.e., in the nonvolatile memory formed in the electric fuse region 7.

Unlike in the present embodiment, when the phase change memory is formed also in the electric fuse region 7 in the same manner as in the phase change memory region 2 and data is recorded in the phase change memory in Step S3 prior to the packaging step (Step S5), the recorded data may be lost due to the thermal history in the packaging step (Step S5), as described above.

In the present embodiment, by contrast, information (data) desired to be recorded prior to the packaging step (Step S5) is recorded in Step S3 prior to the packaging step (Step S5) in a nonvolatile memory of the non-phase change type, i.e., in the nonvolatile memory (such as, e.g., an EPROM or EEPROM) formed in the electric fuse region 7. In the present embodiment, the nonvolatile memory formed in the electric fuse region 7 is not of the phase change type so that it is high in thermal retention resistance. Consequently, the data recorded in the nonvolatile memory in the electric fuse region 7 is less likely to be lost due to heat. Therefore, even when the semiconductor device 1 is heated in the packaging step (Step S5), the data recorded in the nonvolatile memory of the electric fuse region 7 can be prevented from being lost (evaporated or changed) in the packaging step (particularly in the resin encapsulation step of Step S14) of Step S5. As a result, the information (data) recorded in the nonvolatile memory in the electric fuse region 7 before the packaging step (Step S5) can be used after the packaging step (Step S5).

In the case where the packaging step (Step S5) includes a thermal process step at 100 to 300° C., the data recorded in the phase change memory is likely to be lost so that a greater effect is achieved if the present embodiment is applied. In the case where the packaging step (Step S5) includes the resin encapsulation step (Step S14), the semiconductor chip (semiconductor device 1) is likely to be heated in the resin encapsulation step and the data recorded in the phase change memory of the semiconductor chip is likely to be lost so that a greater effect is achieved if the present embodiment is applied.

Thus, in the case of forming the phase change memory functioning as the nonvolatile memory on the semiconductor substrate 11, the present embodiment forms not only the phase change memory but also the nonvolatile memory of the non-phase change type in the semiconductor substrate 11. It follows therefore that the nonvolatile memory of the phase change type (phase change memory) and the nonvolatile memory of the non-phase change type are formed (embedded in mixed relation) in the same semiconductor device (semiconductor chip) 1. Prior to the packaging step (Step S5), data is recorded in the nonvolatile memory in the electric fuse region 7 as the nonvolatile memory of the non-phase change type. This can prevent the data recorded in the nonvolatile memory of the electric fuse region 7 before the packaging step (Step S5) from being lost in the packaging step (Step S5) and allows the data recorded before the packaging step (Step S5) to be used after the packaging step (Step S5). For example, an address at which an effective (in-use) element used during trimming in the semiconductor device is located, an address (relief address data) at which an effective memory cell for memory relief is located, the manufacturing number of the semiconductor device, the history (manufacturing history) of the semiconductor device, and the like can be maintained and used even in the semiconductor device 1*a* in the form of a semiconductor package. As a result, it becomes possible to improve the performance (characteristic) of the semiconductor device (semiconductor chip and the semiconductor package using the same) and also improve the manufacturing yield thereof.

In addition, the present embodiment does not record information (data) in the phase change memory of the phase change memory region 2 before the packaging step (Step S5) but performs the writing of data or the like in the phase change memory of the phase change memory region 2 of the semiconductor device 1*a* in the form of a semiconductor package after the packaging step (Step S5). This can prevent the data recorded in the phase change memory of the phase change memory region 2 from being lost due to the thermal history in the packaging step (Step S5) and allows effective use of the phase change memory formed in the phase change memory region 2.

In the present embodiment, the nonvolatile memory formed in the electric fuse region 7 can function as a fuse circuit (fuse or fuse program circuit). Since information can electrically be recorded in the nonvolatile memory formed in the electric fuse region 7, the recording of information is easy. In addition, the information recorded in the nonvolatile memory formed in the electric fuse region 7 is rewritable. Compared with a fuse circuit which records information in accordance with the melted state of a fuse element, the moisture resistant property of the semiconductor device (semiconductor chip and the semiconductor package using the same) can further be improved since there is no need to form an opening in the protective film (passivation film) over the electric fuse region 7.

Embodiment 2

FIG. 32 is a main-portion cross-sectional view of a semiconductor device according to another embodiment of the present invention, which is a main-portion cross-sectional view of the electric fuse region 7 according to the first embodiment. Since the present embodiment is substantially the same as the first embodiment except for the electric fuse region 7, the description thereof will be omitted herein. In FIG. 32, the depiction of a structure located under an insulating film 81 is omitted. The insulating film (interlayer insulating film) 81 of FIG. 32 corresponds to the insulating film 41 according to the first embodiment or to an insulating film (interlayer insulating film) in an layer located thereabove.

In the first embodiment, the nonvolatile memory (such as, e.g., an EPROM or an EEPROM) of the non-phase change type has been formed as an element for recording information in the electric fuse region 7. In the present embodiment, by contrast, a fuse element composed of a breakable (meltable) conductor film is formed as the element (fuse) for recording information in the electric fuse region 7.

As shown in FIG. 32, wiring 82 is formed on the insulating film (interlayer insulating film) 81 over the substrate 11 (not shown) and an insulating film (interlayer insulating film) 83 is formed on the insulating film 81 to cover the wiring 82. Then, through holes 84 are formed in the insulating film 83 and plugs 85*a* and 85*b* made of tungsten (W) or the like are formed in the through holes 84. Subsequently, a conductor film (conductor layer) 86*a* is formed over the insulating film 83 in which the plugs 85*a* and 85*b* have been buried and patterned by dry etching using a photoresist film (not shown) patterned by a photolithographic technique as an etching mask, thereby forming a fuse element 86 composed of the patterned conductor film 86*a*. The fuse element 86 (conductor film 86*a*) is composed of a conductor film containing aluminum as a main component such as, e.g., an aluminum film or an aluminum alloy film and can also be formed from the same conductor layer as the uppermost wiring layer. The fuse element 86 has both end portions electrically connected to the plugs 85*a* and 85*b* buried in the through holes 84 formed in the insulating film 83. A protective film (passivation film or protective insulating film) 87 is formed on the insulating film 83 to cover the fuse element 86. The protective film 87 is formed with an opening portion 88 for exposing a portion of the fuse element 86. In this manner, the fuse element 86 is formed in the electric fuse region 7. In the present embodiment also, the phase change memory is formed in the phase change memory region 2 in the same manner as in the first embodiment.

FIG. 33 is a main-portion cross-sectional view showing a state in which the fuse element 86 shown in FIG. 32 is broken (melted) by using a laser or the like.

As shown in FIG. 33, the fuse element 86 can be broken by laser irradiation through the opening portion 88 or the like. Whether or not the fuse element 86 has been broken (melted) can be determined by applying a voltage between the plugs 86*a* and 86*b* and examine whether or not a current flows via the fuse element 86. Accordingly, information (data) can be recorded (held, stored, or written) in the electric fuse region 7 based on whether or not the fuse element 86 has been broken. The data recorded in the electric fuse region 7 can be read therefrom by applying a voltage between the plugs 85*a* and 85*b* and examine whether or not a current flows.

In another embodiment, the fuse element 86 can also be formed from a copper film, a copper alloy film, a silicon film (polycrystalline silicon film, silicon film having an impurity introduced therein, or doped polysilicon film), or the like. When the fuse element 86 can be melted by using a laser or the like, the fuse element 86 can be also formed in a layer lower than the uppermost wiring layer.

FIG. 34 is an illustrative chart (table) showing a method of using the fuse element 86 in the electric fuse region 7 and the phase change memory in the phase change memory region 2, which corresponds to FIG. 31 according to the first embodiment.

In the present embodiment, the phase change memory and the fuse element are formed (embedded in mixed relation) in the same semiconductor device (semiconductor chip). Specifically, the phase change memory is formed in the phase change memory region 2 of the semiconductor device 1, while the fuse element 86 composed of the conductor film 86*a* is formed in the electric fuse region 7 of the semiconductor device 1. By forming the phase change memory in the semiconductor device 1, a small-size, large-capacity, and high-speed memory can be implemented. In addition, the fuse element 86 in the electric fuse region 7 is composed of the conductor film 86a and therefore higher in thermal retention resistance than the phase change memory. Accordingly, data loss (evaporation) does not occur in the thermal history in the semiconductor packaging step of Step S5.

The fuse element 86 in the electric fuse region 7 according to the present embodiment can be used similarly to the nonvolatile memory in the electric fuse region 7 according to the first embodiment. As a result, substantially the same effects as obtained in the first embodiment are also obtainable in the present embodiment.

Specifically, as also shown in FIG. 34, information (data) is not recorded in the phase change memory of the phase change memory region 2 but is recorded in the fuse element 86 of the electric fuse region 7 before the packaging step (Step S5). For example, an address at which an effective (in-use) element used during trimming in the semiconductor device is located, an address (relief address data) at which an effective memory cell for memory relief is located, the manufacturing number of the semiconductor device, the history (manufacturing history) of the semiconductor device, or the like is recorded in the fuse element 86 of the electric fuse region 7. Since the fuse element 86 in the electric fuse region 7 is high in thermal retention resistance and data is not lost in the thermal history in the packaging step of Step S5, the data written in the fuse element 86 of the electric fuse region 7 before the packaging step (Step S5) can be maintained and used after the packaging step (Step S5). This allows an improvement in the performance (characteristic) of the semiconductor device (semiconductor chip and the semiconductor package using the same) and also allows an improvement in the manufacturing yield thereof.

Although the first embodiment can rewrite the information recorded in the nonvolatile memory in the electric fuse region 7 after the packaging step (Step S5) as necessary, the present embodiment cannot rewrite the information in the fuse element 86 of the electric fuse region 7 after the packaging step (Step S5) since, according to the present embodiment, the information is recorded based on whether or not the fuse element 86 has been broken. The recording of information in the fuse element 86 of the electric fuse region 7 can be performed only before the packaging step (Step S5).

In addition, the phase change memory (phase change film 35) is formed in a layer different from that of the fuse element (fuse element 86). This is because an excessively large distance between the n-channel MISFET Qn2 and the chalcogenide film 35a (phase change film 35) in the phase change memory region leads to delay in the operation of the phase change memory. Accordingly, the chalcogenide film 35a (phase change film 35) is preferably formed in a lower layer. On the other hand, the fuse element 86 shown in the present embodiment is formed preferably in a highest possible layer since it need to be melted by using a laser or the like. Thus, in the present embodiment, the fuse element (fuse element 86) is formed in a layer higher than the layer of the phase change memory (phase change film 35).

Although the invention achieved by the present inventors has been described specifically with reference to the embodiments thereof, the present invention is not limited thereto. It will be understood that various changes and modifications can be made in the invention without departing from the gist thereof.

The present invention is applied preferably to a semiconductor device including a nonvolatile memory of a phase change type and to a method of manufacturing the same.

What is claimed is:

1. A method of manufacturing a semiconductor device, said method comprising the steps of:
   (a) forming a nonvolatile memory of a first type and a nonvolatile memory of a second type different from said first type in a semiconductor substrate;
   (b) after said step (a), dividing said semiconductor substrate into separate pieces corresponding to individual semiconductor chips;
   (c) packaging each of said semiconductor chips,
   wherein the nonvolatile memory of said first type is a nonvolatile memory of a phase change type,
   wherein the nonvolatile memory of said second type is a nonvolatile memory of a non-phase change type,
   wherein the step (c) includes a thermal process step at 100° to 300° C., and
   wherein said step (c) includes the step of performing resin encapsulation with respect to each of said semiconductor chips;
   said method further comprising the step of:
   (d) after said step (a) and before said step (c), recording first information including trimming data, memory relief information, the manufacturing number of the semiconductor device or the manufacturing history of the semiconductor device in the nonvolatile memory of said second type, and
   wherein, before said step (c), said first information is not recorded in the nonvolatile memory of said first type.

2. A method according to claim 1, wherein said step (d) includes recording information in the nonvolatile memory of said second type through charge injection or charge release.

3. A method according to claim 1, wherein the nonvolatile memory of said second type functions as a fuse circuit.

4. A method of manufacturing a semiconductor device, said method comprising the steps of:
   (a) forming a phase change memory and forming a fuse for recording information in a semiconductor substrate;
   (b) after said step (a), dividing said semiconductor substrate into separate pieces corresponding to individual semiconductor chips;
   (c) packaging each of said semiconductor chips; and
   (d) after said step (a) and before said step (c), recording first information including trimming data, memory relief information, the manufacturing number of the semiconductor device or the manufacturing history of the semiconductor device in said fuse,
   wherein said fuse is comprised of a nonvolatile memory of a non-phase change type and said step (d) includes recording said first information in said fuse through charge injection or charge release,
   wherein said step (c) includes a thermal process step at 100° to 300° C.,
   wherein said step (c) includes the step of performing resin encapsulation with respect to each of said semiconductor chips, and
   wherein, before said step (c), said first information is not recorded in the nonvolatile memory of said first type.

5. A method of manufacturing a semiconductor device, said method comprising the steps of:
   (a) forming a phase change memory in a semiconductor substrate;
   (b) forming a fuse element in said semiconductor substrate;
   (c) after said steps (a) and (b), dividing said semiconductor substrate into separate pieces corresponding to individual semiconductor chips;
   (d) recording first information including trimming data, memory relief information, the manufacturing number of the semiconductor device or the manufacturing history of the semiconductor device in said fuse element; and (e) after said step (d), encapsulating each of said semiconductor chips, wherein said step (a) includes a step of forming a chalcogenide layer, wherein said fuse element is comprised of a nonvolatile memory of a non-phase change type and said step (d) includes recording said first information in said nonvolatile memory through charge injection or charge release, wherein said step (e) includes performing a thermal process at 100° to 300° C., wherein said step (e) includes the step of performing resin encapsulation with respect to each of said semiconductor chips, and wherein, before said step (e), said first information is not recorded in the nonvolatile memory of said first type.

6. A method according to claim 5, wherein said step (b) includes forming said fuse element in a layer different from that of said phase change memory.

7. A method according to claim 1,
wherein the nonvolatile memory of said first type is formed of materials including Ge, Sb and Te.

8. A method according to claim 4,
wherein said phase change memory is formed of materials including Ge, Sb and Te.

9. A method according to claim 5,
wherein said chalcogenide layer includes Ge, Sb and Te.

* * * * *

UNITED STATES PATENT AND TRADEMARK OFFICE
CERTIFICATE OF CORRECTION

PATENT NO. : 7,575,950 B2 Page 1 of 1
APPLICATION NO. : 11/339674
DATED : August 18, 2009
INVENTOR(S) : Kazuyoshi Shiba It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 148 days.

Signed and Sealed this

Seventh Day of September, 2010

David J. Kappos
*Director of the United States Patent and Trademark Office*